US012562689B2

(12) United States Patent
Sugimoto

(10) Patent No.: US 12,562,689 B2
(45) Date of Patent: Feb. 24, 2026

(54) AMPLIFIER UNIT

(71) Applicant: Murata Manufacturing Co., Ltd., Kyoto (JP)

(72) Inventor: Yasutaka Sugimoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 619 days.

(21) Appl. No.: 17/938,749

(22) Filed: Oct. 7, 2022

(65) Prior Publication Data

US 2023/0030235 A1 Feb. 2, 2023

Related U.S. Application Data

(63) Continuation of application No. PCT/JP2021/014736, filed on Apr. 7, 2021.

(30) Foreign Application Priority Data

May 21, 2020 (JP) ................................. 2020-089153

(51) Int. Cl.
H03F 1/30 (2006.01)
H03F 3/195 (2006.01)
H03F 3/45 (2006.01)
(52) U.S. Cl.
CPC ............. H03F 1/302 (2013.01); H03F 1/301 (2013.01); H03F 3/195 (2013.01);
(Continued)
(58) Field of Classification Search
CPC .......... H03F 1/302; H03F 1/301; H03F 3/195; H03F 3/45273; H03F 2200/447;
(Continued)

(56) References Cited

U.S. PATENT DOCUMENTS 9,831,841 B2 * 11/2017 Wu ........................... H03F 1/02
2006/0255858 A1 11/2006 Asano et al.
(Continued)

FOREIGN PATENT DOCUMENTS

JP H04-252606 A 9/1992
JP 2006-319436 A 11/2006
(Continued)

OTHER PUBLICATIONS

International Search Report for PCT/JP2021/014736 dated Jun. 29, 2021.

*Primary Examiner* — Hieu P Nguyen
(74) *Attorney, Agent, or Firm* — McDonald Hopkins LLC

(57) ABSTRACT

An amplifier unit includes an amplifier, a bias circuit, an inductor, a variable resistor circuit, and a control circuit. The amplifier includes an amplifier transistor that amplifies an input radio-frequency signal. The bias circuit is connected to the amplifier. The inductor is connected between and in series with the amplifier and the bias circuit. The variable resistor circuit is connected to the inductor. The control circuit includes a measuring circuit and a comparison circuit. The measuring circuit measures an amplification characteristic value of the amplifier transistor. The comparison circuit compares the amplification characteristic value measured by the measuring circuit with a reference value. The control circuit controls the variable resistor circuit based on a comparison result of the comparison circuit.

15 Claims, 11 Drawing Sheets

(52) U.S. Cl.
CPC ... *H03F 3/45273* (2013.01); *H03F 2200/447*
(2013.01); *H03F 2200/451* (2013.01)

(58) Field of Classification Search
CPC .... H03F 2200/451; H03F 1/303; H03F 1/565;
H03F 3/19; H03F 1/3252
USPC ........................................ 330/285, 296, 289
See application file for complete search history.

(56) References Cited

U.S. PATENT DOCUMENTS

| | | | |
|---|---|---|---|
| 2012/0313709 A1* | 12/2012 | Lautzenhiser | ........ H03F 1/0261 |
| | | | 330/285 |
| 2013/0033327 A1 | 2/2013 | Kadoi et al. | |
| 2018/0034426 A1 | 2/2018 | Tabei et al. | |

FOREIGN PATENT DOCUMENTS

| | | | |
|---|---|---|---|
| JP | 2009-017494 A | 1/2009 |
| JP | 2013-038531 A | 2/2013 |
| JP | 2018-019291 A | 2/2018 |

* cited by examiner

| $\beta$ | Vo1 | Vo2 |
|---|---|---|
| $\beta < \beta 1$ ($\beta < 80$) | Low | Low |
| $\beta 1 < \beta < \beta 2$ ($80 < \beta < 120$) | High | Low |
| $\beta 2 < \beta$ ($120 < \beta$) | High | High |

AMPLIFIER UNIT

CROSS REFERENCE TO RELATED APPLICATION

This is a continuation of International Application No. PCT/JP2021/014736 filed on Apr. 7, 2021 which claims priority from Japanese Patent Application No. 2020-089153 filed on May 21, 2020. The contents of these applications are incorporated herein by reference in their entireties.

BACKGROUND ART

Technical Field

The present disclosure relates to an amplifier unit.

Hitherto, an amplifier circuit that amplifies a radio-frequency signal is known. For example, Patent Document 1 discloses an amplifier circuit including an amplifier transistor and a bias circuit that supplies a bias current to the base of the amplifier transistor.

In the amplifier circuit disclosed in Patent Document 1, a bias inductor is disposed between the bias circuit and the base. The bias inductor functions as a low pass filter that makes it difficult for a radio-frequency signal to flow back to the bias circuit.

Patent Document 1: Japanese Unexamined Patent Application Publication No. 2009-17494

BRIEF SUMMARY

The amplification factor of an amplifier transistor varies in response to a temperature change. To compensate for a change in the amplification factor, it is desirable to supply a suitable bias current in accordance with a temperature change.

In the above-described known amplifier circuit, however, the inductance of the bias inductor is fixed to one value. It is thus difficult to supply a suitable bias current in accordance with a temperature change of the amplifier transistor, thereby failing to suppress the degradation of the linearity of the amplifier transistor.

The present disclosure provides an amplifier unit that is able to suppress the degradation of the linearity caused by a temperature change.

Solution to Problem

An amplifier unit according to an aspect of the present disclosure includes an amplifier, a bias circuit, an inductor, a variable resistor circuit, and a control circuit. The amplifier includes an amplifier transistor that amplifies an input radio-frequency signal. The bias circuit is connected to the amplifier. The inductor is connected between and in series with the amplifier and the bias circuit. The variable resistor circuit is connected to the inductor. The control circuit includes a measuring circuit and a comparison circuit. The measuring circuit measures an amplification characteristic value of the amplifier transistor. The comparison circuit compares the amplification characteristic value measured by the measuring circuit with a reference value. The control circuit controls the variable resistor circuit based on a comparison result of the comparison circuit.

An amplifier unit according to the present disclosure is able to suppress the degradation of the linearity caused by a temperature change.

DETAILED DESCRIPTION

Figure 1:
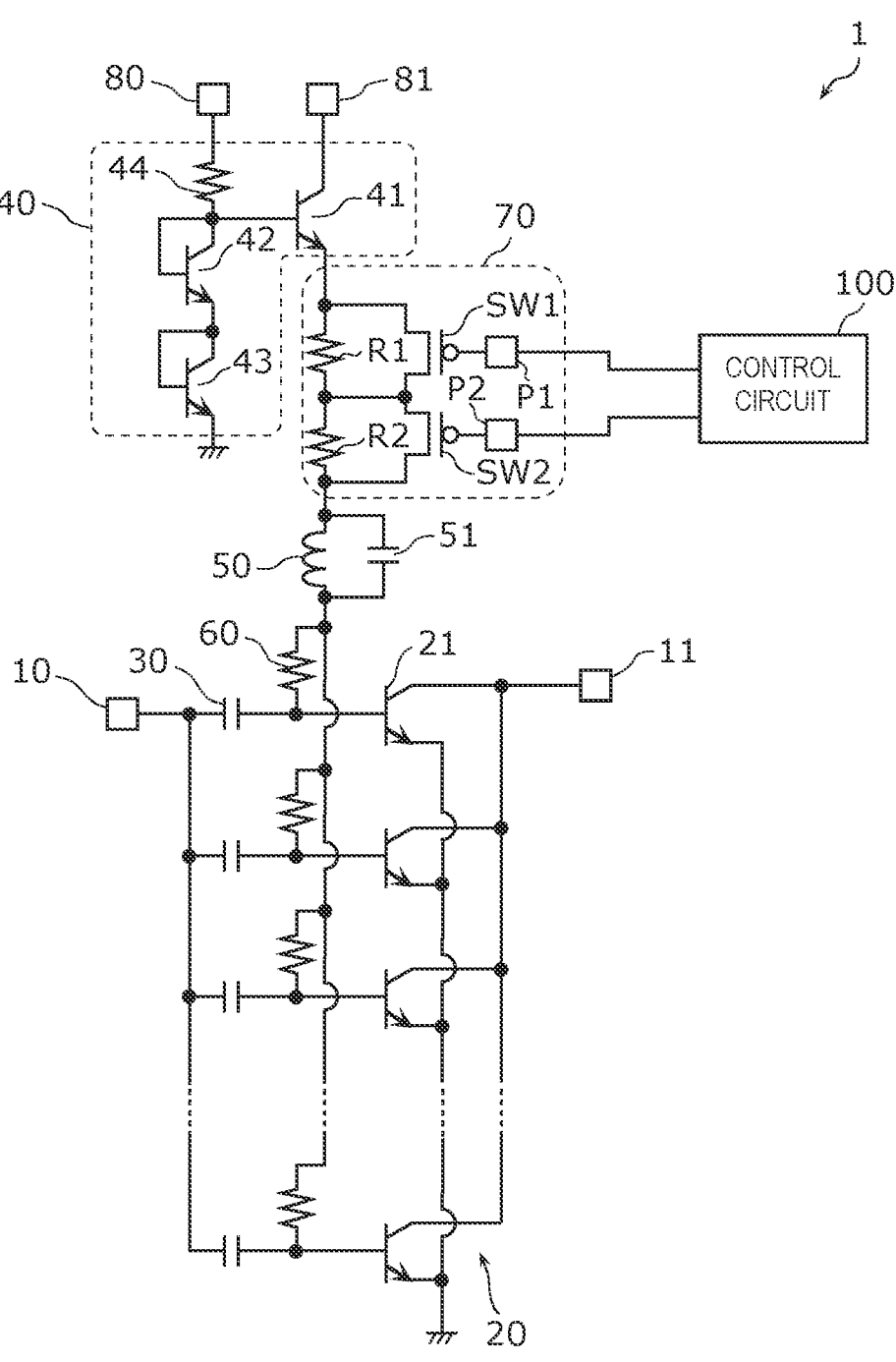
FIG. 1 is a circuit diagram of an amplifier unit according to a first embodiment.

Amplifier units according to embodiments of the disclosure will be described below in detail with reference to the drawings. The embodiments described below illustrate specific examples. The numeric values, configurations, materials, elements, positions and connection states of the elements, steps, and the order of steps illustrated in the following embodiments are only examples and are not described for limiting the disclosure. Among the elements illustrated in the following embodiments, the elements that are not recited in the independent claims will be described as optional elements.

In the drawings, the elements are only schematically, not necessarily precisely, illustrated. For example, the reduced scales in the individual drawings do not necessarily match each other. In the individual drawings, elements having the substantially same configuration are designated by like reference numeral and an explanation thereof will be simplified or not be repeated.

In a description of circuit configurations of the disclosure, "A is directly connected to B" means that A is directly connected to B using a connecting terminal and/or a wiring conductor without necessarily another circuit device interposed between A and B. "A is connected to B" includes, not only the meaning that A is directly connected to B using a connecting terminal and/or a wiring conductor, but also the meaning that A is electrically connected to B via another circuit device. "Being connected between A and B" means that "being connected to both A and B between A and B".

First Embodiment

1-1. Configuration

First, the configuration of an amplifier unit according to a first embodiment will be described below with reference to FIG. 1. FIG. 1 is a circuit diagram of an amplifier unit 1 according to the present embodiment.

The amplifier unit 1 amplifies a radio-frequency signal. A radio-frequency signal is, for example, a signal compliant with a communication standard, such as Wi-Fi (registered trademark), LTE (Long Term Evolution), or 5G (5th Generation). The amplifier unit 1 is, for example, an amplifier circuit that is connected to an antenna device and that amplifies a radio-frequency signal to be sent from the antenna device. The amplifier unit 1 is, for example, a power amplifier which amplifies a radio-frequency signal to be sent. The amplifier unit 1 is disposed in a front-end section of a multimode-/multiband-support cellular phone, for example. The amplifier unit 1 is formed within an IC (Integrated Circuit) device, for example.

As shown in FIG. 1, the amplifier unit 1 includes an amplifier 20, a DC-cut capacitor 30, a bias circuit 40, an inductor 50, a capacitor 51, a ballast resistor 60, a variable resistor circuit 70, power supply terminals 80 and 81, and a control circuit 100. The amplifier 20 includes an input terminal 10, an output terminal 11, and an amplifier transistor 21.

The input terminal 10 is a terminal into which a radio-frequency signal is input. An RFIC (not shown), for example, is connected to the input terminal 10.

The output terminal 11 is a terminal from which a radio-frequency signal amplified by the amplifier transistor 21 is output. An antenna device is connected to the output terminal 11 via a switch circuit (not shown), for example.

The amplifier 20 includes at least one amplifier transistor 21. The amplifier transistor 21 is a bipolar transistor and has a base, a collector, and an emitter. The amplifier transistor 21 is an npn bipolar transistor made of silicon (Si) or silicon germanium (SiGe), for example.

The base of the amplifier transistor 21, which is an example of a control terminal, is connected to the input terminal 10 via the DC-cut capacitor 30. The collector of the amplifier transistor 21 is connected to the output terminal 11. The emitter of the amplifier transistor 21 is connected to a ground (that is, it is grounded).

In the present embodiment, the amplifier 20 includes multiple amplifier transistors 21. The multiple amplifier transistors 21 form a multicell bipolar transistor set. The collector of each amplifier transistor 21 is connected to that of another amplifier transistor 21 and is also connected to the output terminal 11. The emitter of each amplifier transistor 21 is connected to that of another amplifier transistor 21 and is also connected to a ground. The base of each amplifier transistor 21 is connected to the input terminal 10 via the corresponding DC-cut capacitor 30. The base of each amplifier transistor 21 is connected to that of another amplifier transistor 21 via the corresponding ballast resistor 60 and is connected to the inductor 50. That is, one end of each of the plural ballast resistors 60 is connected to the base of the corresponding amplifier transistor 21. The other end of each of the plural ballast resistors 60 is connected to the inductor 50. The amplifier 20 may include only one amplifier transistor 21.

The DC-cut capacitor 30 removes DC components contained in a radio-frequency signal input into the input terminal 10. The DC-cut capacitor 30 is disposed on and in parallel with a path which links the input terminal 10 and the base of the amplifier transistor 21 with each other. More specifically, one end of the DC-cut capacitor 30 is connected to the input terminal 10, while the other end is connected to the base of the amplifier transistor 21.

The bias circuit 40 is a circuit that supplies a bias current to the control terminal of the amplifier transistor 21. The bias circuit 40 includes an emitter-follower circuit. More specifically, as shown in FIG. 1, the bias circuit 40 includes transistors 41, 42, and 43 and a resistor 44.

Each of the transistors 41, 42, and 43 is a bipolar transistor and has a base, a collector, and an emitter. Each of the transistors 41, 42, and 43 is an npn bipolar transistor made of silicon (Si) or silicon germanium (SiGe), for example.

The transistor 41 is a transistor forming the emitter-follower circuit. The base of the transistor 41 is connected to the base and the collector of the transistor 42 and also to one end of the resistor 44. The collector of the transistor 41 is connected to the power supply terminal 81. The emitter of the transistor 41 is connected to the inductor 50 via the variable resistor circuit 70. The emitter of the transistor 41 may be directly connected to the inductor 50.

The transistors 42 and 43 are provided to stabilize a base current flowing through the transistor 41. The base and the collector of the transistor 42 are connected to each other and are connected to one end of the resistor 44 and to the base of the transistor 41. The base and the collector of the transistor 43 are connected to each other and are connected to the emitter of the transistor 42. The emitter of the transistor 43 is connected to a ground.

The resistor 44 is disposed between and in series with the base of the transistor 41 and the power supply terminal 80. More specifically, one end of the resistor 44 is connected to the base of the transistor 41 and to the base and the collector of the transistor 42. The other end of the resistor 44 is connected to the power supply terminal 80.

The bias circuit 40 configured as described above supplies, as a bias current, a collector current flowing through the transistor 41 to the base of the amplifier transistor 21. In the present embodiment, the inductor 50, the ballast resistor 60, and the variable resistor circuit 70 are connected between and in series with the emitter of the transistor 41 and the base of the amplifier transistor 21. With this arrangement, the magnitude of the collector current of the transistor 41 is adjusted and a suitable level of the bias current is supplied to the base of the amplifier transistor 21.

The inductor 50 is disposed between and in series with the emitter of the emitter-follower circuit included in the bias circuit 40 and the control terminal of the amplifier transistor 21. More specifically, one end of the inductor 50 is connected to the emitter of the transistor 41 via the variable resistor circuit 70, while the other end of the inductor 50 is connected to the ballast resistor 60.

The inductor 50 is a choke inductor and functions as a low pass filter that makes it difficult for a radio-frequency signal input into the input terminal 10 to flow through the bias circuit 40. However, the inductor 50 does not completely block a radio-frequency signal. Part of a radio-frequency signal is coupled to the transistor 41 of the bias circuit 40 via the inductor 50.

The inductor 50 is constituted by a wiring pattern formed in an IC device, for example. The inductor 50 is a spiral inductor, for example, made of a conductive material, such as a metal.

The capacitor 51 is connected in parallel with the inductor 50. Connecting the capacitor 51 in parallel with the inductor 50 can easily increase the impedance between the bias circuit 40 and the base of the amplifier transistor 21. More specifically, even with a decreased inductance value of the inductor 50, providing the capacitor 51 having a small capacitance value can increase the impedance. This makes it possible to reduce the size of the inductor 50 while maintaining a high level of impedance.

The ballast resistor 60 is disposed between and in series with the inductor 50 and the control terminal of the amplifier transistor 21. More specifically, one end of the ballast resistor 60 is connected to the inductor 50. The other end of the ballast resistor 60 is connected to the path which links the DC-cut capacitor 30 and the base of the amplifier transistor 21 with each other. That is, the other end of the ballast resistor 60 is electrically connected directly to the base of the amplifier transistor 21.

The variable resistor circuit 70 is connected to the inductor 50. In the present embodiment, the variable resistor circuit 70 is an example of a variable resistor circuit connected in series with the inductor 50. More specifically, one end of the variable resistor circuit 70 is connected to the emitter of the transistor 41 forming the emitter-follower circuit of the bias circuit 40. The other end of the variable resistor circuit 70 is connected to one end of the inductor 50.

The variable resistor circuit 70 may be disposed between the inductor 50 and the base of the amplifier transistor 21. More specifically, one end of the variable resistor circuit 70 may be connected to the other end (the terminal closer to the amplifier transistor 21) of the inductor 50, while the other end of the variable resistor circuit 70 may be connected to the base of the amplifier transistor 21 or to the ballast resistor 60.

As shown in FIG. 1, the variable resistor circuit 70 includes two resistors R1 and R2, two switches SW1 and SW2, and two control terminals P1 and P2. Each of the number of resistors, that of switches, and that of control terminals may be one or three or more. The number of resistors and that of switches are the same but they may be different from each other. The number of switches and that of control terminals are the same.

The two resistors R1 and R2 are connected in series with each other. The resistance values of the two resistors R1 and R2 are equal to each other. Alternatively, they may be different from each other.

The two switches SW1 and SW2 are switching elements, such as MOSFETs (Metal Oxide Semiconductor Field Effect Transistors). The MOSFETs are p-type MOSFETs but they may be n-type MOSFETs. Alternatively, the MOSFETs may include both of p-type MOSFETs and n-type MOSFETs.

The switch SW1 is switched between a conducting (ON) state and a non-conducting (OFF) state in accordance with a control signal supplied to the control terminal P1, while the switch SW2 is switched between the conducting (ON) state and the non-conducting (OFF) state in accordance with a control signal supplied to the control terminal P2. The control terminal P1 is connected to the gate of the switch SW1, while the control terminal P2 is connected to the gate of the switch SW2. Separately supplying a control signal to each of the control terminals P1 and P2 makes it possible to switch between the ON/OFF states of each of the switches SW1 and SW2 independently of each other.

By switching between the ON/OFF states of each of the switches SW1 and SW2, the resistance value of the variable resistor circuit 70 can be adjusted.

For example, when the switches SW1 and SW2 are both OFF, the variable resistor circuit 70 operates as a series circuit of the resistors R1 and R2. When only the switch SW1 is ON and the switch SW2 is OFF, the variable resistor circuit 70 operates as a circuit of the resistor R2 only. When only the switch SW2 is ON and the switch SW1 is OFF, the variable resistor circuit 70 operates as a circuit of the resistor R1 only. When the switches SW1 and SW2 are both ON, the variable resistor circuit 70 operates as a circuit which is substantially short-circuited across the terminals (more specifically, across the emitter of the transistor 41 and one end of the inductor 50). In this manner, it is possible to change the resistance value of the variable resistor circuit 70 by switching between the ON/OFF states of each of the switches SW1 and SW2. More specifically, as more switches are ON, the resistance value of the variable resistor circuit 70 becomes smaller.

The power supply terminal 80 is a power supply terminal for controlling the emitter-follower circuit of the bias circuit 40. The power supply terminal 81 is a power supply terminal for supplying a bias current. Each of the power supply terminals 80 and 81 is connected to a corresponding voltage source that supplies a preset voltage.

The control circuit 100 controls the variable resistor circuit 70. The specific configuration of the control circuit 100 will be discussed later.

1-2. Functions of Ballast Resistor, Inductor, and Variable Resistor Circuit

Typically, the amplifier transistor 21 used as a power amplifier that amplifies a radio-frequency signal is biased to a class AB performance level to achieve high efficiency. Additionally, to reduce thermal runaway of the amplifier transistor 21, the ballast resistor 60 is disposed between the base of the amplifier transistor 21 and the bias circuit 40.

A temperature rise of the amplifier transistor 21 lowers the threshold of the amplifier transistor 21, which encourages the flowing of a large collector current through the amplifier transistor 21. This causes the occurrence of thermal runaway. This phenomenon poses a problem particularly in the amplifier unit 1 including the multicell amplifier transistors 21 shown in FIG. 1 because it increases a thermal difference between the cells.

The ballast resistor 60 is used as measures against the occurrence of thermal runaway. More specifically, a high bias current flowing through the ballast resistor 60 causes a voltage drop in the ballast resistor 60, which can decrease the base potential of the amplifier transistor 21. This can reduce the occurrence of thermal runaway of the amplifier transistor 21 caused by an increased collector current due to a temperature rise.

Typically, as RF output power is increased, the collector current of the amplifier transistor 21 biased to the class AB performance level becomes higher. This elevates DC power supplied to the amplifier transistor 21 in response to an increase in RF output power, so that the amplifier transistor 21 can operate at a constant gain until RF output power reaches high power. As discussed above, however, the ballast resistor 60 suppresses an increase in the collector current. Because of the presence of the ballast resistor 60, the gain of the amplifier transistor 21 becomes lower as RF output power is increased. To obtain good EVM (Error Vector Magnitude) characteristics by using the amplifier unit 1 as a transmit circuit, it is desirable to maintain the gain of the amplifier transistor 21 in response to a change in RF output power. To put it another way, the bias circuit 40 desirably has a function of increasing a collector current in response to a change in RF output power while the ballast resistor 60, which is suitable for reducing the occurrence of thermal runaway, is provided.

In the present embodiment, the inductor 50 is connected between the path which links the input terminal 10 and the base of the amplifier transistor 21 and the emitter of the emitter-follower circuit (more specifically, the emitter of the transistor 41) included in the bias circuit 40. With this arrangement, part of a radio-frequency signal to be supplied to the base of the amplifier transistor 21 from the input terminal 10 is coupled to the bias circuit 40 via the inductor 50. Coupling part of a radio-frequency signal to the bias circuit 40 can supply a suitable level of a bias current to the amplifier transistor 21. This makes it likely to maintain the gain of the amplifier transistor 21 at a constant level in response to a change in output power.

A smaller inductance value of the inductor 50 increases the coupling amount between a radio-frequency signal and the bias circuit 40. A larger inductance value of the inductor 50 decreases the coupling amount between a radio-frequency signal and the bias circuit 40. That is, adjusting the inductance value of the inductor 50 can control the coupling amount. By controlling the coupling amount in accordance with the characteristics of the amplifier transistor 21, the gain is more likely to be maintained at a constant level in response to a change in output power.

Nevertheless, varying the inductance value of the inductor 50 is not easy. To change the inductance value, it is necessary to change the pattern of the inductor 50, which results in poor design efficiency.

To address this issue, in the amplifier unit 1 according to the present embodiment, the variable resistor circuit 70 is connected to the inductor 50. The inductance value of the inductor 50 is fixed. Varying the resistance value of the variable resistor circuit 70 can change the impedance between a line which links the input terminal 10 and the base of the amplifier transistor 21 and the emitter of the transistor 41 of the bias circuit 40. As a result of changing the impedance, the coupling amount between a radio-frequency signal and the bias circuit 40 can be adjusted.

In the amplifier unit 1 according to the present embodiment, the gain is likely to be maintained at a constant level in response to a change in output power. This makes it possible to implement the amplifier unit 1 exhibiting more suitable linearity than in the related art. The variable resistor circuit 70 included in the amplifier unit 1 functions as a resistor that attenuates distortion of a radio-frequency signal at the output terminal 11.

If the amplifier transistor 21 has high heat dissipation characteristics, the provision of the ballast resistor 60 may be omitted.

1-3. Control Circuit

The specific configuration of the control circuit 100 will now be described below with reference to FIG. 2.

Figure 2:
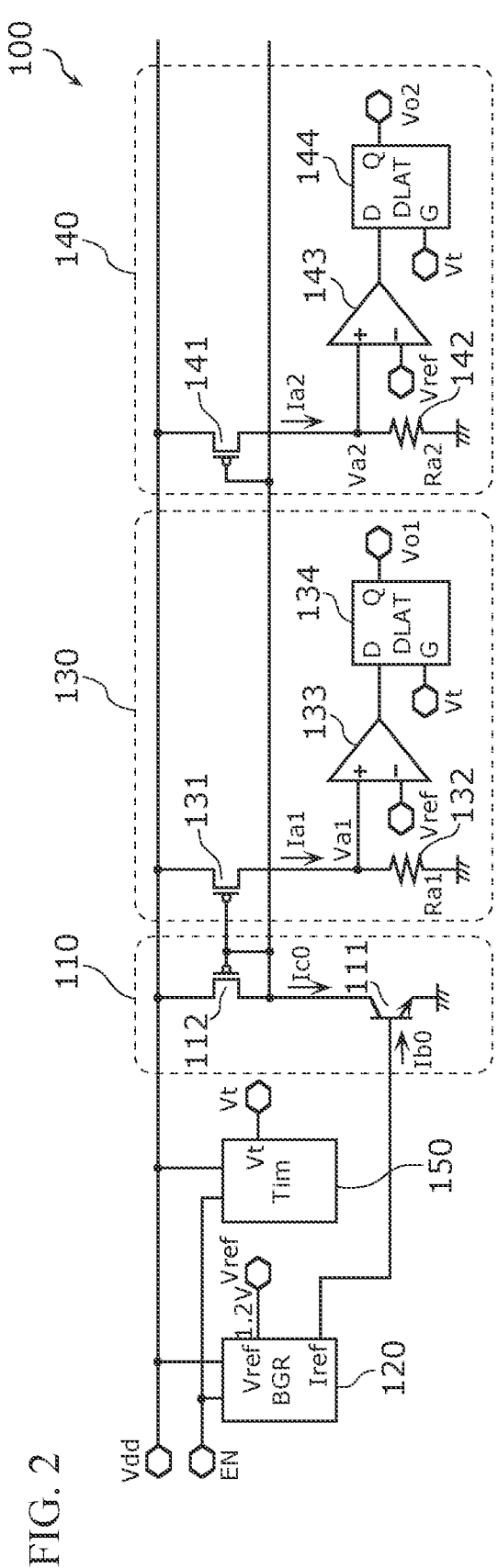
FIG. 2 is a circuit diagram of a control circuit of the amplifier unit according to the first embodiment.

FIG. 2 is a circuit diagram of the control circuit 100 of the amplifier unit 1 according to the present embodiment. As shown in FIG. 2, the control circuit 100 includes a measuring circuit 110, a reference voltage source 120, comparison circuits 130 and 140, and a timing circuit 150.

In the present embodiment, the control circuit 100 compares a current amplification factor $\beta$ with two reference values $\beta 1$ and $\beta 2$ by using the two comparison circuits 130 and 140. In one example, $\beta 1$ is set to be 80 and $\beta 2$ is set to be 120. The comparison circuit 130 compares the current amplification factor $\beta$ with the reference value $\beta 1$. The comparison circuit 140 compares the current amplification factor $\beta$ with the reference value 132. The control circuit 100 may include only one of the comparison circuits 130 and 140 and compare the current amplification factor $\beta$ with only one of the reference values.

The measuring circuit 110 measures the current amplification factor $\beta$ of the amplifier transistor 21. The current amplification factor $\beta$ is an example of an amplification characteristic value of the amplifier transistor 21. As shown in FIG. 2, the measuring circuit 110 includes a replica transistor 111 and a transistor 112. The measuring circuit 110 measures the current amplification factor of the replica transistor 111 as the current amplification factor $\beta$ of the amplifier transistor 21.

The replica transistor 111 is a transistor having the same temperature change characteristics as the amplifier transistor 21. The replica transistor 111 is a transistor for monitoring the current amplification factor. For example, the replica transistor 111 is the same type of transistor as the amplifier transistor 21. More specifically, the replica transistor 111 has an emitter, a base, and a collector, as in the amplifier transistor 21.

The replica transistor 111 may be smaller than the amplifier transistor 21 if it has the same temperature change characteristics as the amplifier transistor 21. The replica transistor 111 is disposed within the same chip as the amplifier transistor 21. During the operation of the amplifier transistor 21, a temperature change substantially equal to that of the amplifier transistor 21 occurs in the replica transistor 111.

As shown in FIG. 2, the base of the replica transistor 111 is connected to the reference voltage source 120. The collector of the replica transistor 111 is an example of an output terminal of the replica transistor 111 and is connected to the drain of the transistor 112. The emitter of the replica transistor 111 is connected to a ground.

A constant current Ib0 is supplied to the base of the replica transistor 111 from the reference voltage source 120. The constant current Ib0 is 10 μA, for example. When the constant current Ib0 is supplied to the base of the replica transistor 111, a collector current Ic0 flows through the collector of the replica transistor 111. The magnitude of the collector current Ic0 is expressed by $\beta \times Ib0$, where $\beta$ is the current amplification factor of the replica transistor 111 and is also that of the amplifier transistor 21.

The transistor 112 is an example of a first transistor connected to the output terminal of the replica transistor 111. The transistor 112 is a p-type MOSFET, for example. The source of the transistor 112 is connected to a power supply voltage Vdd. The drain of the transistor 112 is connected to the collector of the replica transistor 111. The gate of the transistor 112 is connected to the gate of a transistor 131 of the comparison circuit 130. The gate and the drain of the transistor 112 are connected to each other. The transistors 112 and 131 form a current mirror circuit.

In the present embodiment, the gate of the transistor 112 is also connected to the gate of a transistor 141 of the comparison circuit 140. The transistors 112 and 141 form a current mirror circuit.

The reference voltage source 120 generates a reference voltage Vref. The reference voltage source 120 is connected to a second input terminal of a comparator 133 of the comparison circuit 130 and to a second input terminal of a comparator 143 of the comparison circuit 140. The reference voltage source 120 supplies the reference voltage Vref to the second input terminals. The reference voltage Vref is 1.2 V, for example.

The reference voltage source 120 also generates the constant current Ib0. The reference voltage source 120 is connected to the base of the replica transistor 111. The reference voltage source 120 supplies the constant current Ib0 to the base of the replica transistor 111.

The reference voltage source 120 generates the reference voltage Vref and the constant current Ib0 based on the power supply voltage Vdd. An enable signal EN is supplied to the reference voltage source 120. The timing at which the reference voltage source 120 supplies the reference voltage Vref and the constant current Ib0 is controlled based on the enable signal EN.

The comparison circuit 130 compares the current amplification factor measured by the measuring circuit 110 with the reference value. Specifically, as shown in FIG. 2, the comparison circuit 130 includes the transistor 131, a resistor 132, the comparator 133, and a D latch circuit 134.

The transistor 131 is an example of a second transistor connected to a first input terminal of the comparator 133. The transistor 131 forms a current mirror circuit with the transistor 112. The transistor 131 is of the same polarity and the same type as the transistor 112. In the present embodiment, since the transistor 112 is a p-type MOSFET, the transistor 131 is also a p-type MOSFET.

The source of the transistor 131 is connected to the power supply voltage Vdd. The drain of the transistor 131 is connected to the first input terminal of the comparator 133. The drain of the transistor 131 is also connected to a ground via the resistor 132. The gate of the transistor 131 is connected to the gate of the transistor 112 of the measuring circuit 110.

The transistor 131 forms a current mirror circuit with the transistor 112. Accordingly, when the current Ic0 flows through the drain of the transistor 112, a current Ia1 flows through the drain of the transistor 131. When the mirror ratio of the current mirror circuit is 1:1, the current Ia1 becomes equal to the current Ic0. The mirror ratio may be other than 1:1.

The resistor 132 is connected between the drain of the transistor 131 and a ground. The terminal of the resistor 132 closer to the drain of the transistor 131 is connected to the first input terminal of the comparator 133. With this configuration, the resistor 132 supplies a voltage Va1 corresponding to the current Ia1 flowing through the drain of the transistor 131 to the first input terminal of the comparator 133. For example, when the resistance value of the resistor 132 is Ra1, the voltage Va1 to be supplied to the first input terminal is expressed by Ia1×Ra1. Since Ia1=Ic0=$\beta$×Iref, Va1 is represented by the following expression (1).

$$Va1 = \beta \times Iref \times Ra1 \qquad (1)$$

The comparator 133 has a first input terminal, a second input terminal, and an output terminal. In the present embodiment, the comparator 133 is a digital comparator and outputs a comparison result from the output terminal as a digital signal. The comparator 133 is an operational amplifier, for example. The first input terminal is a non-inverting input terminal (+) of the operational amplifier. The second input terminal is an inverting input terminal (−) of the operational amplifier. Alternatively, the first input terminal may be the inverting input terminal (−), while the second input terminal may be the non-inverting input terminal (+).

More specifically, the comparator 133 compares the voltage Va1 input into the first input terminal with the reference voltage Vref input into the second input terminal and outputs a comparison result from the output terminal as a digital signal. The output digital signal is represented by a binary value, that is, a high level or low level. For example, as represented by expression (2), when the voltage Va1 is greater than the reference voltage Vref, the digital signal is made to have a high level (High). As represented by expression (3), when the voltage Va1 is smaller than the reference voltage Vref, the digital signal is made to have a low level (Low).

High: $Va1 > Vref$ (2)

Low: $Va1 < Vref$ (3)

As a result of substituting expression (1) into each of expressions (2) and (3) and solving expressions (2) and (3) for $\beta$, the high level and the low level of a digital signal are represented by the following expressions (4) and (5).

High: $\beta > Vref/(Iref \times Ra1)$ (4)

Low: $\beta < Vref/(Iref \times Ra1)$ (5)

As stated above, since Vref=1.2 V and Iref=10 µA, Ra1 is set to be 1.5 kΩ. The right sides (=$\beta$1) of expressions (4) and (5) are calculated as 80. That is, the high level (High) and the low level (Low) of a digital signal are represented by the following expressions (6) and (7).

High: $\beta > \beta1 = 80$ (6)

Low: $\beta < \beta1 = 80$ (7)

In this manner, the current amplification factor $\beta$ measured by the measuring circuit 110 can be compared with the reference value $\beta1$. Changing at least one of Vref, Iref, and Ra1, the reference value $\beta1$ can be set to a desirable value.

The D latch circuit 134 is an example of a retain circuit that retains a signal output from the output terminal of the comparator 133. The D latch circuit 134 retains the signal level of a digital signal for a certain period and then outputs the digital signal.

The D latch circuit 134 is connected to the output terminal of the comparator 133. The D latch circuit 134 has a D terminal, a G terminal, and a Q terminal. The D terminal is connected to the output terminal of the comparator 133. The G terminal is connected to the timing circuit 150. The Q terminal is one of the output terminals of the control circuit 100 and is connected to the variable resistor circuit 70. For example, the Q terminal is connected to the control terminal P1 of the variable resistor circuit 70.

The comparison circuit 140 compares the current amplification factor $\beta$ measured by the measuring circuit 110 with the reference value. The configuration of the comparison circuit 140 is similar to that of the comparison circuit 130. More specifically, as shown in FIG. 2, the comparison circuit 140 includes a transistor 141, a resistor 142, a comparator 143, and a D latch circuit 144. The transistor 141, the resistor 142, the comparator 143, and the D latch circuit 144 respectively correspond to the transistor 131, the resistor 132, the comparator 133, and the D latch circuit 134 of the comparison circuit 130.

The comparison circuit 140 differs from the comparison circuit 130 in that the resistance value of the resistor 142 is different from that of the resistor 132. For example, a resistance value Ra2 of the resistor 142 is 1 kΩ.

Accordingly, the magnitude of a voltage Va2 input into the first input terminal of the comparator 143 is different from that of the voltage Va1 input into the first input terminal of the comparator 133. This enables the comparator 143 to output a comparison result by using a reference value different from that of the comparator 133. That is, the comparison circuit 140 makes a comparison by using the reference value, which is different from that of the comparison circuit 130. More specifically, the high level (High) and the low level (Low) of a digital signal output from the comparator 143 are represented by the following expressions (8) and (9).

High: $\beta > Vref/(Iref \times Ra2) = \beta2 = 120$ (8)

Low: $\beta < Vref/(Iref \times Ra2) = \beta2 = 120$ (9)

Figures 3, 4:
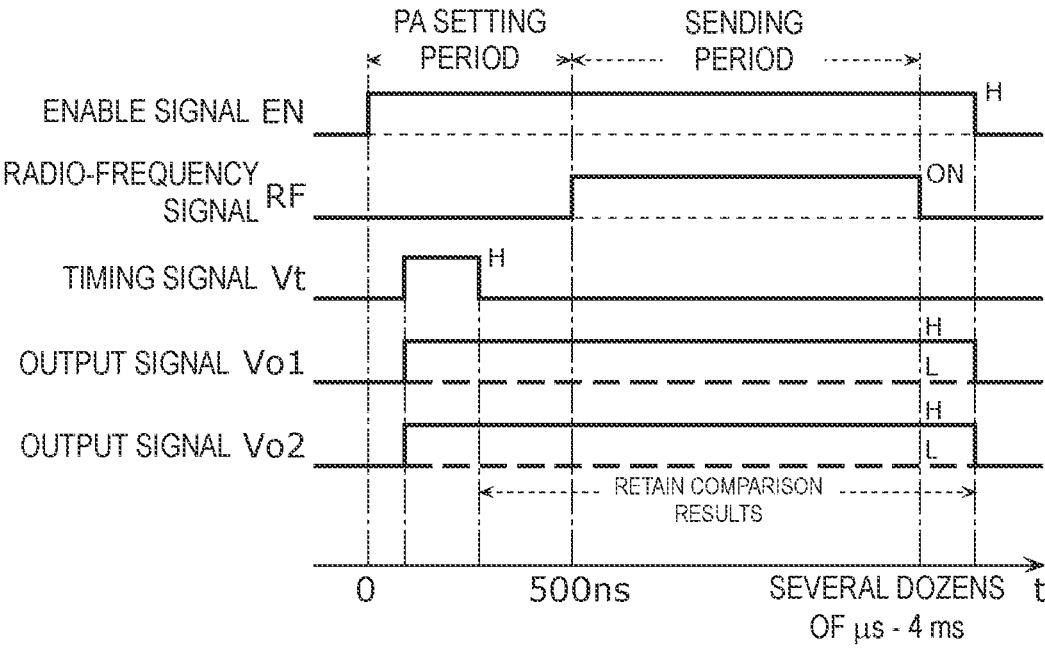
FIG. 3 is a table illustrating examples of control signals supplied to a variable resistor circuit from the control circuit of the first embodiment.
FIG. 4 is a time chart illustrating an operation of the amplifier unit according to the first embodiment.

By combining expressions (6) through (9), a combination of control signals output from the control circuit 100 is that illustrated in FIG. 3. FIG. 3 is a table illustrating examples of control signals (output signals) supplied to the variable resistor circuit 70 from the control circuit 100 of the present embodiment. In FIG. 3, an output signal Vo1 indicates the signal level of a digital signal output from the comparison circuit 130, while an output signal Vo2 indicates the signal level of a digital signal output from the comparison circuit 140.

The output terminal of the comparison circuit 130 is connected to the control terminal P1 of the variable resistor circuit 70. The ON/OFF states of the switch SW1 is thus controlled in accordance with the signal level of the output signal Vo1. When the signal level of the output signal Vo1 is a low level, the switch SW1 enters the conducting (ON) state. When the signal level of the output signal Vo1 is a high level, the switch SW1 enters the non-conducting (OFF) state.

The output terminal of the comparison circuit 140 is connected to the control terminal P2 of the variable resistor circuit 70. The ON/OFF states of the switch SW2 is thus controlled in accordance with the signal level of the output signal Vo2. When the signal level of the output signal Vo2 is a low level, the switch SW2 enters the conducting (ON) state. When the signal level of the output signal Vo2 is a high level, the switch SW2 enters the non-conducting (OFF) state.

With this configuration, when the current amplification factor $\beta$ is smaller than the reference value $\beta 1$ (=80), the two switches SW1 and SW2 are both ON and the resistance value of the variable resistor circuit 70 becomes substantially 0. When the current amplification factor $\beta$ is larger than the reference value $\beta 1$ and is smaller than the reference value $\beta 2$ (=120), the switch SW1 is OFF and the switch SW2 is ON. The resistance value of the variable resistor circuit 70 thus becomes equivalent to the resistance value of the resistor R1. When the current amplification factor $\beta$ is larger than the reference value $\beta 2$, the two switches SW1 and SW2 are both OFF and the resistance value of the variable resistor circuit 70 becomes equal to the total of the resistance value of the resistor R1 and that of the resistor R2.

In this manner, the control circuit 100 can make the resistance value of the variable resistor circuit 70 greater as the current amplification factor $\beta$ is larger. This makes it possible to suppress the degradation of the linearity caused by an ambient temperature change of the amplifier transistor 21. Details of this will be discussed later with reference to FIGS. 5A-5C.

1-4. Operation

The operation of the amplifier unit 1 will be described below. FIG. 4 is a time chart illustrating the operation of the amplifier unit 1 according to the present embodiment. More specifically, FIG. 4 illustrates a time change of major signals processed by the control circuit 100 of the amplifier unit 1.

The amplifier unit 1 is operated based on the enable signal EN. More specifically, when the enable signal EN is at a high level, the amplifier unit 1 is operated to amplify a radio-frequency signal to be sent. The period for which the enable signal EN is at a high level includes a setting period of the amplifier 20 and a sending period of a radio-frequency signal RF.

The setting period is a period from when the amplifier unit 1 is started (that is, from when the EN signal is made to have a high level) until when a radio-frequency signal RF is input.

The sending period is a period for which the radio-frequency signal RF remains in the amplifier unit 1. In wireless communication, typically, sending data is divided into multiple packets and the packets are sent one by one. To reduce the current consumption, the amplifier unit 1 is started slightly before data is sent and is turned OFF after the data is sent.

During the setting period of the amplifier 20, when a timing signal Vt is made to have a high level, the control circuit 100 starts operating, and the measuring circuit 110 measures the current amplification factor $\beta$ and the comparison circuits 130 and 140 compares the current amplification factor $\beta$ with the reference values $\beta 1$ and $\beta 2$, respectively. This can control the ON/OFF states of each of the switches SW1 and SW2 of the variable resistor circuit 70 based on the comparison results and adjust the resistance value of the variable resistor circuit 70 before the radio-frequency signal RF is sent.

Even if the current amplification factor $\beta$ of the amplifier transistor 21 is varied due to a change in the ambient temperature, the resistance value of the variable resistor circuit 70 can be adjusted before a radio-frequency signal is sent. This can suppress the degradation of the linearity caused by a change in the current amplification factor $\beta$. It is also possible to suppress the degradation of the linearity caused by a change in the current amplification factor $\beta$ due to process variations.

In the present embodiment, since the comparison circuits 130 and 140 include the D latch circuits 134 and 144, respectively, comparison results are retained for a certain period. More specifically, comparison results are retained at least until the sending period is over. In the present embodiment, comparison results are retained until a time point at which the enable signal EN is changed from the high level to the low level.

As shown in FIG. 4, while comparison results are retained, the signal levels of the output signals Vo1 and Vo2 are retained. This can maintain the ON/OFF states of the switches SW1 and SW2 of the variable resistor circuit 70. This makes it less likely to cause a change in the variable resistor circuit 70 while the radio-frequency signal RF is being sent and to change the characteristics, such as the gain, of the amplifier transistor 21.

1-5. Advantages and Others

As described above, the amplifier unit 1 according to the present embodiment includes the amplifier 20, the bias circuit 40, the inductor 50, the variable resistor circuit 70, and the control circuit 100. The amplifier 20 includes the amplifier transistor 21 that amplifies an input radio-frequency signal. The bias circuit 40 is connected to the amplifier 20. The inductor 50 is connected between and in series with the amplifier 20 and the bias circuit 40. The variable resistor circuit 70 is connected to the inductor 50. The control circuit 100 includes the measuring circuit 110 and the comparison circuit 130 or 140. The measuring circuit 110 measures the current amplification factor $\beta$ of the amplifier transistor 21. The comparison circuit 130 compares the current amplification factor $\beta$ measured by the measuring circuit 110 with the reference value $\beta 1$. The comparison circuit 140 compares the current amplification factor $\beta$ measured by the measuring circuit 110 with the reference value $\beta 2$. The control circuit 100 controls the variable resistor circuit 70 based on a comparison result of the comparison circuit 130 or 140.

As a result of controlling the variable resistor circuit 70 based on comparison results of the current amplification factor β of the amplifier transistor 21 with the reference values β1 and β2, the coupling amount between a radio-frequency signal and the bias circuit 40 can be adjusted. By adjusting the coupling amount to a suitable value, an appropriate level of a bias current can be supplied to the base of the amplifier transistor 21. It is thus likely to maintain the gain of the amplifier transistor 21 at a constant level in response to a change in output power.

For example, when the current amplification factor β is varied due to a temperature change of the amplifier transistor 21, an appropriate level of a bias current can be supplied in accordance with the magnitude of the current amplification factor β, and the impedance of the bias circuit 40 can also be adjusted. This makes it possible to suppress the degradation of the linearity of amplification characteristics caused by a temperature change of the amplifier transistor 21.

Advantages of the amplifier unit 1 will be discussed below based on the specific configuration of the amplifier unit 1.

Figures 5A, 5B, 5C:
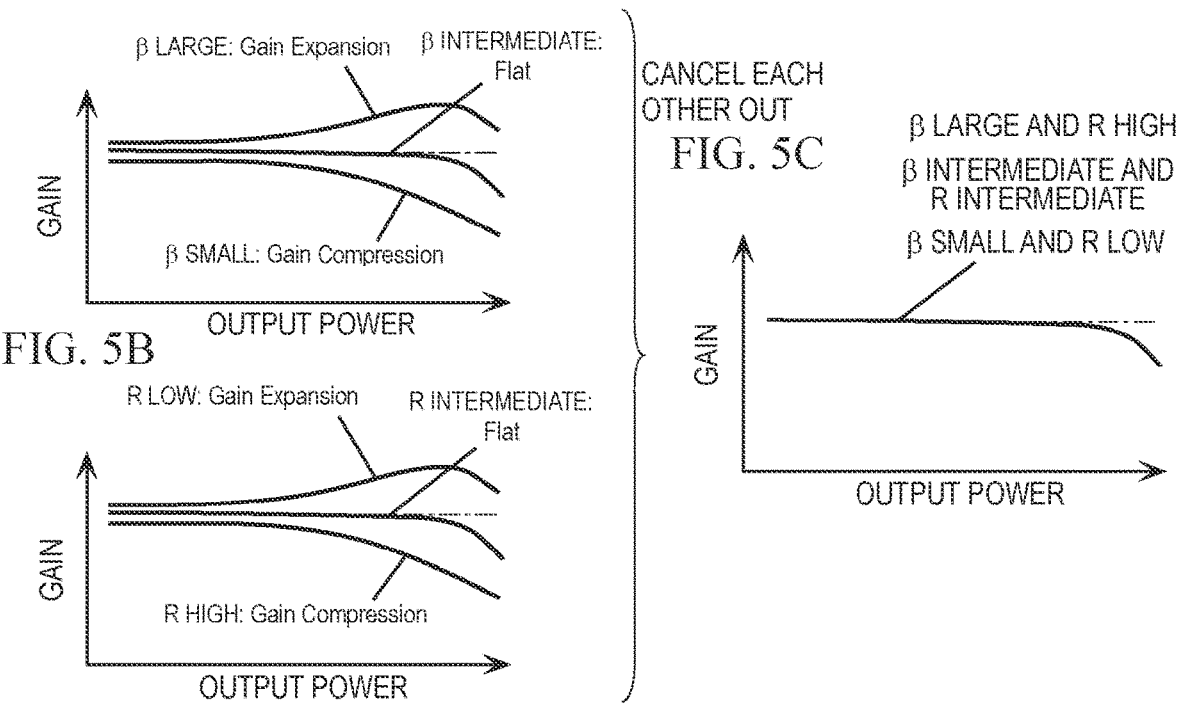
FIGS. 5A-5C show graphs for explaining the amplifier unit according to the first embodiment.

FIGS. 5A-5C show graphs for explaining advantages of the amplifier unit 1 according to the present embodiment. FIG. 5A through FIG. 5C all illustrate the relationship between output power and the gain of the amplifier transistor 21. In each graph, the horizontal axis indicates output power, while the vertical axis indicates the gain.

As shown in FIG. 5A, in the amplifier transistor 21 biased to the class AB performance level, in the case of a large current amplification factor β, gain expansion is likely to occur. That is, as output power is higher, the gain becomes higher. Conversely, in the case of a small current amplification factor β, gain compression is likely to occur. That is, as output power is higher, the gain becomes lower. In this manner, the gain is distorted in accordance with the magnitude of the current amplification factor β, thereby degrading the linearity of the amplifier transistor 21.

As shown in FIG. 5B, in the amplifier transistor 21 biased to the class AB performance level, in the case of a low ballast resistance, gain expansion is likely to occur. Conversely, in the case of a high ballast resistance, gain compression is likely to occur.

In the present embodiment, the resistance value of the variable resistor circuit 70, which serves as part of the ballast resistance of the amplifier transistor 21, is changed, thereby canceling gain expansion and gain compression each other out. This can reduce the distortion of the gain regardless of the magnitude of the current amplification factor β, as shown in FIG. 5C. That is, it is possible to suppress the degradation of the linearity caused by a temperature change of the amplifier transistor 21.

More specifically, in the case of a large current amplification factor β, the resistance value of the variable resistor circuit 70 is increased. For example, if the current amplification factor β is larger than the reference value β2, the output signals Vo1 and Vo2 are both made to have a high level, as shown in FIG. 3, and the switches SW1 and SW2 are both turned OFF, thereby increasing the resistance value of the variable resistor circuit 70. This can cancel gain expansion caused by a large current amplification factor β out by gain compression resulting from the increased resistance value of the variable resistor circuit 70.

In the case of a small current amplification factor β, the resistance value of the variable resistor circuit 70 is decreased. For example, if the current amplification factor β is smaller than the reference value β1, the output signals Vo1 and Vo2 are both made to have a low level, as shown in FIG.

3, and the switches SW1 and SW2 are both turned ON, thereby decreasing the resistance value of the variable resistor circuit 70. This can cancel gain compression caused by a small current amplification factor β out by gain expansion resulting from the decreased resistance value of the variable resistor circuit 70.

Neither the execution of testing for the amplifier unit 1 nor the provision of an eFuse for storing measurement results of the current amplification factor β is required. A bias current is not adjusted based on information stored in an eFuse. It is thus not necessary to secure a region for providing an eFuse and a control circuit therefor. This achieves miniaturization of the control circuit 100. By using the amplifier unit 1 according to the present embodiment, not only the degradation of the linearity caused by process variations, but also the degradation of the linearity caused by a dynamic reason, such as an ambient temperature change, can be suppressed. That is, the amplifier unit 1 can compensate for static and dynamic distortion characteristics.

In one example, the measuring circuit 110 measures the current amplification factor of the replica transistor 111 as the current amplification factor β of the amplifier transistor 21. The replica transistor 111 has the same temperature change characteristics as the amplifier transistor 21. The amplifier transistor 21 and the replica transistor 111 are both bipolar transistors.

The measuring circuit 110 does not directly measure the current amplification factor β of the amplifier transistor 21, thereby simplifying the configuration of the measuring circuit 110.

In one example, the measuring circuit 110 includes the transistor 112 connected to the output terminal of the replica transistor 111. The comparison circuit 130 includes the comparator 133 and the transistor 131. The comparator 133 has first and second input terminals and an output terminal. The transistor 131 is connected to the first input terminal of the comparator 133. The reference voltage Vref corresponding to a reference value is input into the second input terminal. The transistor 112 and the transistor 131 form a current mirror circuit.

With this configuration, the same current as that flowing through the replica transistor 111 can flow through the comparison circuit 130. After the current is converted into a voltage in the comparison circuit 130, the voltage can be compared with the reference voltage Vref. That is, the current amplification factor β is converted into a voltage and is then compared with the reference voltage, thereby implementing easy and accurate comparison and making it possible to compensate for distortion characteristics by using comparison output.

In one example, the control circuit 100 also includes the reference voltage source 120 which is connected to the second input terminal and which generates the reference voltage Vref.

This can stably supply a constant voltage and a constant current, thereby enhancing the accuracy of comparison.

In one example, the comparator 133 outputs a comparison result from the output terminal as a digital signal.

This can adjust the resistance value of the variable resistor circuit 70 by digital control.

In one example, the variable resistor circuit 70 includes the resistor R1 and the switch SW1 connected to the resistor R1. The switch SW1 is switched between ON and OFF based on a digital signal.

Switching between the ON/OFF states of the switch can readily change the resistance of the variable resistor circuit 70.

In one example, the control circuit 100 also includes a retain circuit that retains a signal input into the first input terminal or a signal output from the output terminal. The retain circuit is, for example, a D latch circuit connected to the output terminal.

By using the retain circuit to retain a signal for a certain period, the resistance value of the variable resistor circuit 70 can be maintained for a certain period.

In one example, the retain circuit retains the above-described signal while a radio-frequency signal remains in the amplifier unit 1.

With this configuration, the resistance value of the variable resistor circuit 70 is less likely to change during the sending period of a radio-frequency signal. This further makes it less likely to change the current amplification factor β during the sending of a radio-frequency signal and to discretely vary the signal strength of the radio-frequency signal.

1-6. Modified Examples

A modified example of the first embodiment will be described below with reference to FIG. 6. The modified example will be discussed by mainly referring to points different from the first embodiment while an explanation of the same points is omitted or simplified.

Figure 6:
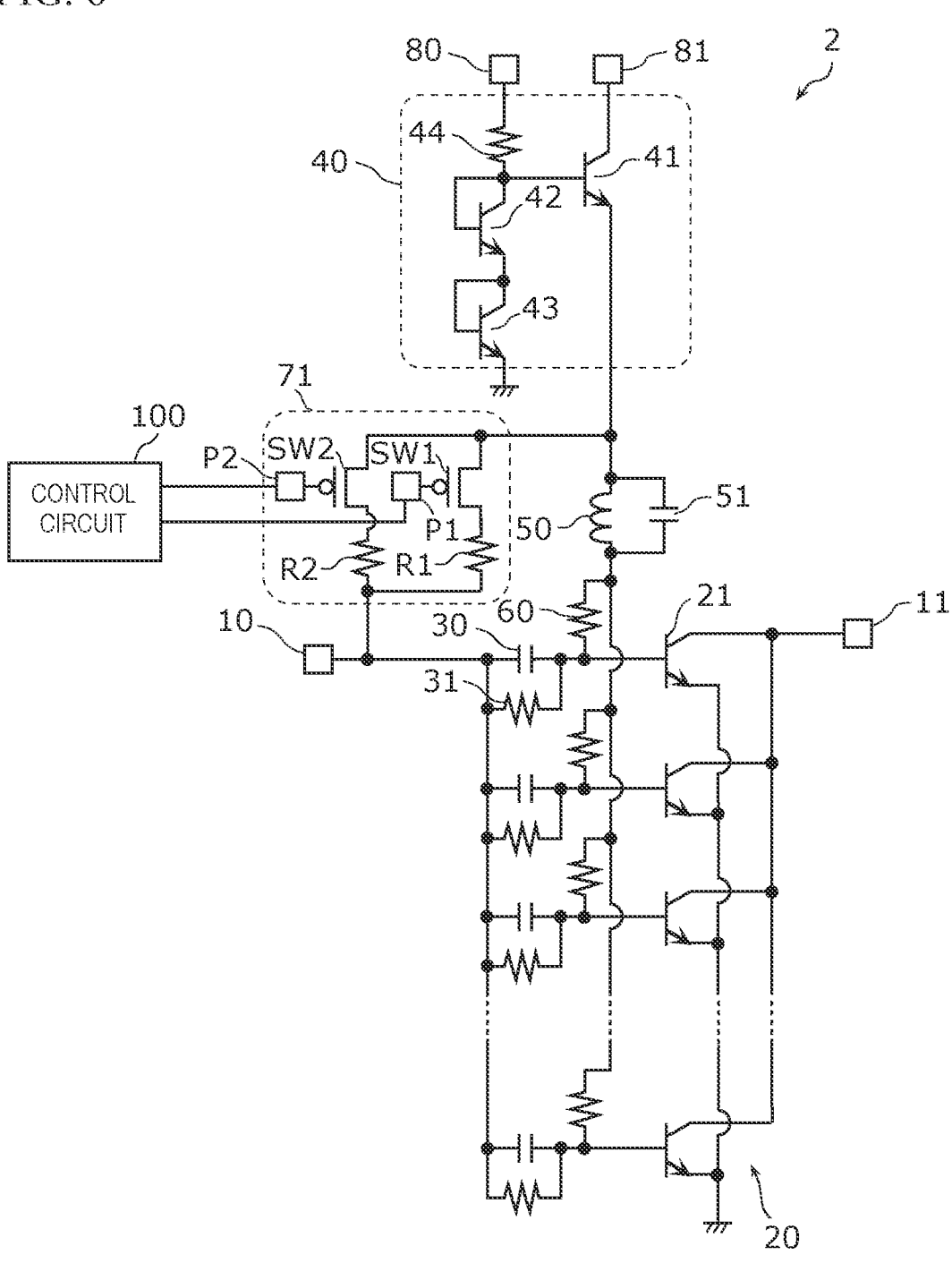
FIG. 6 is a circuit diagram of an amplifier unit according to a modified example of the first embodiment.

FIG. 6 is a circuit diagram of an amplifier unit 2 according to the present modified example. As shown in FIG. 6, the amplifier unit 2 is different from the amplifier unit 1 in that it includes a variable resistor circuit 71 instead of the variable resistor circuit 70. Additionally, a resistor 31 is connected in parallel with the DC-cut capacitor 30 to form a regulator circuit. The provision of the regulator circuit can enhance the stability (K-factor) in response to oscillation in a low-frequency region. Nonetheless, the provision of the resistor 31 may be omitted, as shown in FIG. 1.

The variable resistor circuit 71 is connected to the path which links the input terminal 10 and the base of the amplifier transistor 21 with each other and is also connected to the terminal of the inductor 50 closer to the bias circuit 40. More specifically, the variable resistor circuit 71 connects the path which links the input terminal 10 and the DC-cut capacitor 30 and the path which links the emitter of the transistor 41 (that is, the emitter of the emitter-follower circuit) of the bias circuit 40 and the inductor 50. That is, the variable resistor circuit 71 serves as a bypass path from the input terminal 10 to the emitter of the transistor 41 of the bias circuit 40. Part of a radio-frequency signal input into the input terminal 10 flows to the bias circuit 40 via the variable resistor circuit 71 and is coupled to the bias circuit 40. Hence, as in the first embodiment, it is possible to control the coupling amount between a radio-frequency signal and the bias circuit 40 by adjusting the resistance value of the variable resistor circuit 71.

The variable resistor circuit 71 includes two resistors R1 and R2, two switches SW1 and SW2, and two control terminals P1 and P2. The connection relationship between the individual elements in the variable resistor circuit 71 is different from that in the variable resistor circuit 70 of the first embodiment.

More specifically, the resistor R1 and the switch SW1 are connected in series with each other, while the resistor R2 and the switch SW2 are connected in series with each other. A series circuit of the resistor R1 and the switch SW1 and a series circuit of the resistor R2 and the switch SW2 are connected in parallel with each other.

With this configuration, when the switches SW1 and SW2 are ON, the variable resistor circuit 71 operates as a parallel resistor of the resistors R1 and R2, and the resistance value becomes smaller than each of the resistors R1 and R2. When only the switch SW1 is ON and the switch SW2 is OFF, the variable resistor circuit 71 operates as a circuit of the resistor R1 only. When only the switch SW2 is ON and the switch SW1 is OFF, the variable resistor circuit 71 operates as a circuit of the resistor R2 only. When the switches SW1 and SW2 are OFF, the variable resistor circuit 71 becomes open. In this manner, it is possible to change the resistance value of the variable resistor circuit 71 by switching between the ON/OFF states of each of the switches SW1 and SW2. More specifically, as more switches are ON, the resistance value of the variable resistor circuit 71 becomes smaller.

In the amplifier unit 2 of the present modified example, too, as in the case of the ballast resistance of the first embodiment shown in FIG. 5B, when the resistance of the variable resistor circuit 71 is low, gain expansion is likely to occur, while, when the resistance of the variable resistor circuit 71 is high, gain compression is likely to occur.

Hence, as in the first embodiment, by changing the resistance value of the variable resistor circuit 71 in accordance with the magnitude of the current amplification factor β, gain expansion and gain compression can cancel each other out. This can reduce the distortion of the gain regardless of the magnitude of the current amplification factor β, as shown in FIG. 5C.

More specifically, in the case of a large current amplification factor β, the resistance value of the variable resistor circuit 71 is increased. For example, if the current amplification factor β is larger than the reference value β2, the output signals Vo1 and Vo2 are both made to have a high level, as shown in FIG. 3, and the switches SW1 and SW2 are turned OFF, thereby increasing the resistance value of the variable resistor circuit 71. This can cancel gain expansion caused by a large current amplification factor β out by gain compression resulting from the increased resistance value of the variable resistor circuit 71.

In the case of a small current amplification factor β, the resistance value of the variable resistor circuit 71 is decreased. For example, if the current amplification factor β is smaller than the reference value β1, the output signals Vo1 and Vo2 are both made to have a low level, as shown in FIG. 3, and the switches SW1 and SW2 are turned ON, thereby decreasing the resistance value of the variable resistor circuit 71. This can cancel gain compression caused by a small current amplification factor β out by gain expansion resulting from the decreased resistance value of the variable resistor circuit 71.

The variable resistor circuits 70 and 71 are not restricted to a particular configuration. The variable resistor circuits 70 and 71 may be configured in any manner if the resistance values of the variable resistor circuits 70 and 71 are made variable based on output signals from the control circuit 100 to reduce the distortion of the gain of the amplifier transistor 21.

Second Embodiment

An amplifier unit according to a second embodiment will now be described below. The amplifier unit of the second embodiment is different from that of the first embodiment mainly in the specific configurations of a control circuit and a variable resistor circuit. The control circuit of the present embodiment utilizes an analog signal. The second embodiment will be discussed by mainly referring to points different from the first embodiment while an explanation of the same points is omitted or simplified.

2-1. Configuration

Figure 7:
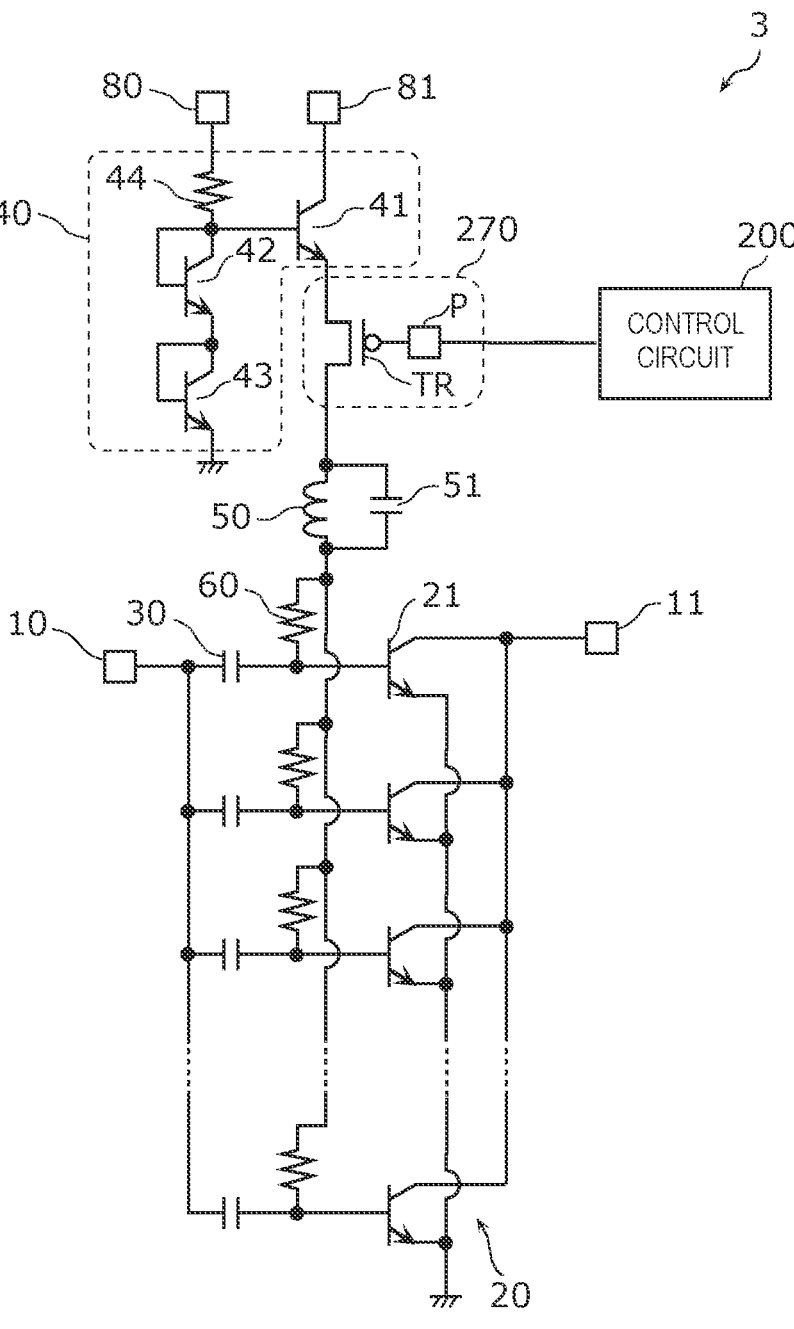
FIG. 7 is a circuit diagram of an amplifier unit according to a second embodiment.

The configuration of the amplifier unit according to the second embodiment will first be discussed below with reference to FIG. 7. FIG. 7 is a circuit diagram of an amplifier unit 3 according to the present embodiment.

As shown in FIG. 3, the amplifier unit 3 is different from the amplifier unit 1 shown in FIG. 1 in that it includes a variable resistor circuit 270 and a control circuit 200 instead of the variable resistor circuit 70 and the control circuit 100. The specific configuration of the control circuit 200 will be discussed later.

The variable resistor circuit 270 includes a transistor TR and a control terminal P. The variable resistor circuit 270 may include two or more transistors and two or more control terminals. For example, plural transistors TR may be connected in series with or in parallel with each other. The plural transistors TR may be those having the same characteristics or those having different characteristics.

The transistor TR is a MOSFET. More specifically, the transistor TR is a p-type MOSFET. In response to a change in a voltage to be applied to the control terminal P of the transistor TR, the resistance value of the transistor TR is also changed. More specifically, the ON-resistance of the transistor TR is changed in accordance with the signal level (the magnitude of a signal voltage) of a control signal to be supplied to the control terminal P.

That is, the variable resistor circuit 270 utilizes a change in the ON-resistance of the transistor TR as variable resistance. Since the variable resistor circuit 270 does not include any resistor, it can be reduced in size.

2-2. Control Circuit

The specific configuration of the control circuit 200 will now be described below with reference to FIG. 8.

Figure 8:
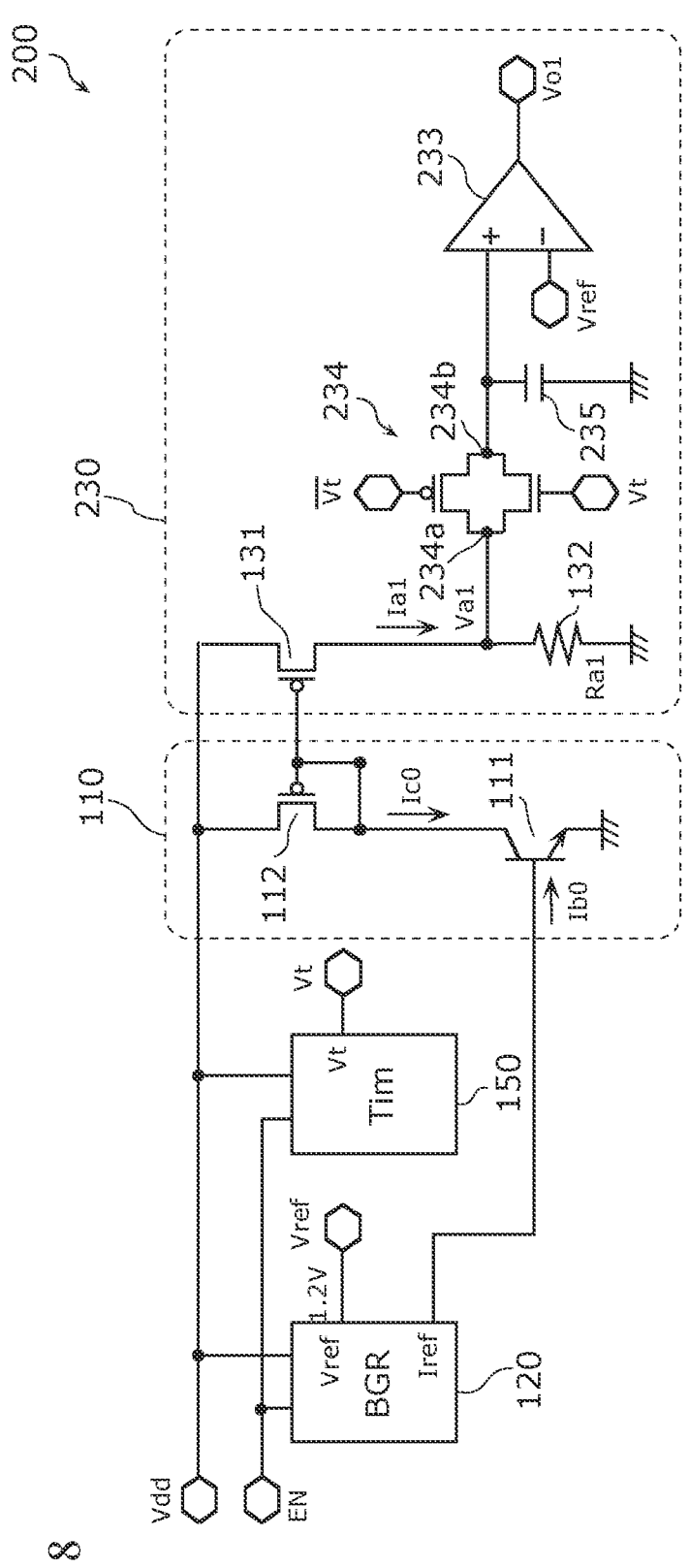
FIG. 8 is a circuit diagram of a control circuit of the amplifier unit according to the second embodiment.

FIG. 8 is a circuit diagram of the control circuit 200 of the amplifier unit 3 according to the present embodiment. As shown in FIG. 8, the control circuit 200 includes a measuring circuit 110, a reference voltage source 120, a comparison circuit 230, and a timing circuit 150. The measuring circuit 110, the reference voltage source 120, and the timing circuit 150 are the same as those of the first embodiment.

The comparison circuit 230 includes a transistor 131, a resistor 132, a comparator 233, a transmission gate 234, and a capacitor 235. The transistor 131 and the resistor 132 are the same as those of the first embodiment. Accordingly, the current Ia1, which is equivalent to the current Ic0 flowing through the replica transistor 111, flows through the resistor 132.

The comparator 233 has first and second input terminals and an output terminal. In the present embodiment, the comparator 233 is an analog comparator and outputs a comparison result from the output terminal as an analog signal. The comparator 233 is an operational amplifier, for example. The first input terminal is the non-inverting input terminal (+) of the operational amplifier. The second input terminal is the inverting input terminal (−) of the operational amplifier. Alternatively, the first input terminal may be the inverting input terminal (−), while the second input terminal may be the non-inverting input terminal (+).

The comparator 233 compares the voltage Va1 input into the first input terminal with the reference voltage Vref input into the second input terminal and outputs a comparison result from the output terminal as an analog signal. More specifically, the comparator 233 is a differential amplifier which amplifies the difference between the voltage Va1 and the reference voltage Vref and outputs the amplified difference. As the difference between the voltage Va1 and the reference voltage Vref is greater, an analog signal having a higher level is output.

The transmission gate 234 includes a terminal 234a and a terminal 234b, which is connected to the comparator 233, and switches between the ON/OFF states between the terminals 234a and 234b. More specifically, the transmission gate 234 includes two transistors which are opposite in polarity. For example, the transmission gate 234 includes a p-type MOSFET and an n-type MOSFET whose sources are connected to each other and whose drains are connected to each other. One of a node between the connected sources and a node between the connected drains is the terminal 234a, while the other node is the terminal 234b. One of control signals which are opposite in polarity is input into the gate of the p-type MOSFET, while the other control signal is input into the gate of the n-type MOSFET. With this configuration, the p-type MOSFET and the n-type MOSFET can be turned ON simultaneously and be turned OFF simultaneously. In the present embodiment, a timing signal Vt from the timing circuit 150 is input into the gate of each MOSFET.

The terminal 234a of the transmission gate 234 is an example of a first terminal and is connected to a node between the transistor 131 and the resistor 132. The terminal 234b of the transmission gate 234 is an example of a second terminal and is connected to the comparator 233. More specifically, the terminal 234b is connected to the first input terminal of the comparator 233.

The transmission gate 234 can make the potentials of the terminals 234a and 234b equal to each other with high precision. For example, when the voltage Va1 at the terminal 234a is increased, the gate-source voltage of the n-type MOSFET becomes insufficient, which may fail to turn ON the n-type MOSFET. Even in this case, the p-type MOSFET is turned ON, so that the terminals 234a and 234b can be kept at the same potential.

The capacitor 235 is shunt-connected to the terminal 234b. That is, one end of the capacitor 235 is connected to the terminal 234b, and the other end is connected to a ground. The capacitor 235 retains a signal which passes through the transmission gate 234 and which is to be input into the comparator 233. More specifically, the capacitor 235 retains the voltage Va1 at the terminal 234a of the transmission gate 234.

The transmission gate 234 and the capacitor 235 may be connected to the output terminal of the comparator 233. For example, the terminal 234a of the transmission gate 234 is an example of the second terminal and is connected to the output terminal of the comparator 233. The terminal 234b of the transmission gate 234 is an example of the first terminal and is connected to the control terminal P of the variable resistor circuit 270. The capacitor 235 is connected to the terminal 234b.

2-3. Operation

Figure 9:
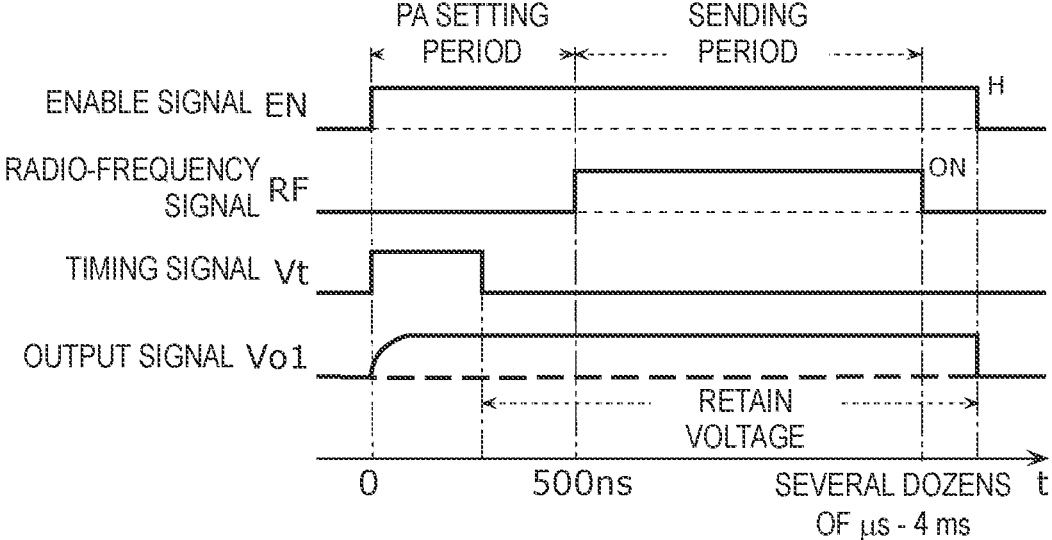
FIG. 9 is a time chart illustrating an operation of the amplifier unit according to the second embodiment.

The operation of the amplifier unit 3 will be described below. FIG. 9 is a time chart illustrating the operation of the amplifier unit 3 according to the present embodiment. More specifically, FIG. 9 illustrates a time change of major signals processed by the control circuit 200 of the amplifier unit 3.

In the present embodiment, at the same time as the enable signal EN being made to have a high level, the timing circuit 150 sets the timing signal Vt to a high level. This turns ON the transmission gate 234 so as to store electric charge in the capacitor 235 based on the voltage Va1 at the node between the transistor 131 and the resistor 132. The voltage Va1 is then retained in the capacitor 235.

Since the first input terminal of the comparator 233 is connected to the capacitor 235, the output signal Vo1 to be output from the output terminal of the comparator 233 is changed in response to a change in the voltage retained in the capacitor 235. More specifically, as shown in FIG. 9, at the same time as the timing signal Vt being made to have a high level, the signal level of the output signal Vo1 starts to rise from 0 V and is then maintained at a constant signal level.

Even after the timing signal Vt is changed to a low level, the voltage Va1 is retained in the capacitor 235. The signal level of the output signal Vo1 is thus maintained during the sending period of the radio-frequency signal RF. When the enable signal EN is changed to a low level, electric charge stored in the capacitor 235 is discharged, and the signal level of the output signal Vo1 drops to 0 V.

Figure 10:
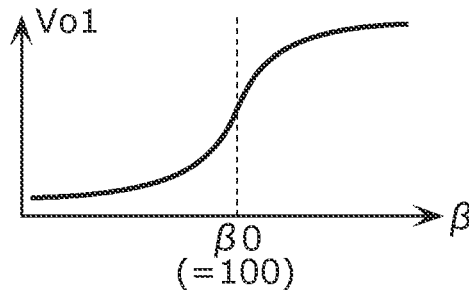
FIG. 10 is a graph illustrating an example of a control signal to be supplied to a variable resistor circuit from the control circuit of the second embodiment.

The signal level of the output signal Vo1 is determined based on the difference between the current amplification factor $\beta$ and a reference value $\beta 0$, as shown in FIG. 10.

FIG. 10 is a graph illustrating an example of a control signal (output signal) to be supplied to the variable resistor circuit 270 according to the present embodiment. In FIG. 10, the horizontal axis indicates the current amplification factor $\beta$, while the vertical axis indicates the signal level of a control signal, which is an analog signal output from the comparison circuit 230.

FIG. 10 shows that, as the measured current amplification factor $\beta$ is larger than the reference value $\beta 0$, which is for the current amplification factor, corresponding to the reference voltage Vref, the signal level of the output signal Vo1 becomes higher. FIG. 10 also shows that, as the measured current amplification factor $\beta$ is smaller than the reference value $\beta 0$, the signal level of the output signal Vo1 becomes lower. The signal level of the output signal Vo1 changes gradually in response to the current amplification factor $\beta$. In one example, $\beta 0$ is set to be 100, but it is not limited to a particular value.

The reference value $\beta 0$ is represented by the following expression (10).

$$\beta 0 = V\mathrm{ref}/(I\mathrm{ref} \times Ra1) \tag{10}$$

Since Vref=1.2 V and Iref=10 µA, Ra1 is set to be 1.2 kΩ. This results in $\beta 0$=100.

The output terminal of the comparison circuit 230 is connected to the control terminal P of the variable resistor circuit 270 shown in FIG. 10. Based on the control signal (output signal Vo1) input into the control terminal P, the transistor TR is controlled.

The transistor TR is a p-type MOSFET. Accordingly, as the signal level of the output signal Vo1 input into the control terminal P is lower, the ON-resistance of the transistor TR becomes lower. For example, when the current amplification factor $\beta$ is smaller than $\beta 0$, the ON-resistance of the transistor TR becomes lower. The resistance value of the variable resistor circuit 270 thus becomes smaller. As a result, as in the first embodiment, gain compression (FIG. 5A) caused by a small current amplification factor $\beta$ can be canceled out by gain expansion (FIG. 5B) resulting from the decreased resistance value of the variable resistor circuit 270.

As the signal level of the output signal Vo1 input into the control terminal P is higher, the ON-resistance of the transistor TR becomes higher. For example, when the current amplification factor $\beta$ is larger than $\beta 0$, the ON-resistance of the transistor TR becomes higher. The resistance value of the variable resistor circuit 270 thus becomes larger. As a result, as in the first embodiment, gain expansion (FIG. 5A) caused by a large current amplification factor $\beta$ can be canceled out by gain compression (FIG. 5B) resulting from the increased resistance value of the variable resistor circuit 270.

The transistor TR may be an n-type MOSFET. In this case, the shape of the control signal based on the reference value $\beta 0$ is line-symmetrical to that in the graph shown in FIG. 10. That is, as the measured current amplification factor $\beta$ is larger than the reference value $\beta 0$, which is for the current amplification factor, corresponding to the reference voltage Vref, the signal level of the output signal Vo1 becomes lower. As the measured current amplification factor $\beta$ is smaller than the reference value $\beta 0$, the signal level of the output signal Vo1 becomes higher.

2-4. Advantages and Others

As described above, in the amplifier unit 3 according to the present embodiment, the comparator 233 outputs a comparison result from the output terminal as an analog signal.

This can adjust the resistance value of the variable resistor circuit 270 by analog control.

In one example, the variable resistor circuit 270 includes the transistor TR having the control terminal P connected to the output terminal.

This configuration can implement a variable resistor circuit suitable for an analog signal. For example, it is possible to implement a variable resistor circuit that is reduced in size and can vary the resistance value with high precision.

In one example, the retain circuit includes the transmission gate 234 and the capacitor 235. The transmission gate 234 includes the terminal 234a and the terminal 234b, which is connected to the comparator 233. The transmission gate 234 switches between the ON/OFF states between the terminals 234a and 234b. The capacitor 235 is shunt-connected to the terminal 234a or 234b. In one example, the terminal 234a is connected to the transistor 131, while terminal 234b is connected to the first input terminal of the comparator 233. The capacitor 235 is connected to the terminal 234b.

This configuration can reduce the influence of a change in the voltage at the terminal 234a of the transmission gate 234 and retain the voltage Va1 generated in the resistor 132 with high precision. Hence, the measurement accuracy of the voltage amplification factor $\beta$ can be improved. It is thus possible to supply a suitable bias current to the amplifier transistor 21 and also to adjust the impedance of the bias circuit 40. This further makes it possible to suppress the degradation of the linearity of the amplifier transistor 21.

Since the voltage is retained in the capacitor 235, the resistance value of the variable resistor circuit 270 is less likely to change during the sending period of a radio-frequency signal, for example. This further makes it less likely to change the gain of the amplifier transistor 21 during the sending of a radio-frequency signal.

2-5. Modified Examples

Modified examples of the second embodiment will now be described below. The modified examples will be discussed by mainly referring to points different from the second embodiment while an explanation of the same points is omitted or simplified.

2-5-1. First Modified Example

Figure 11:
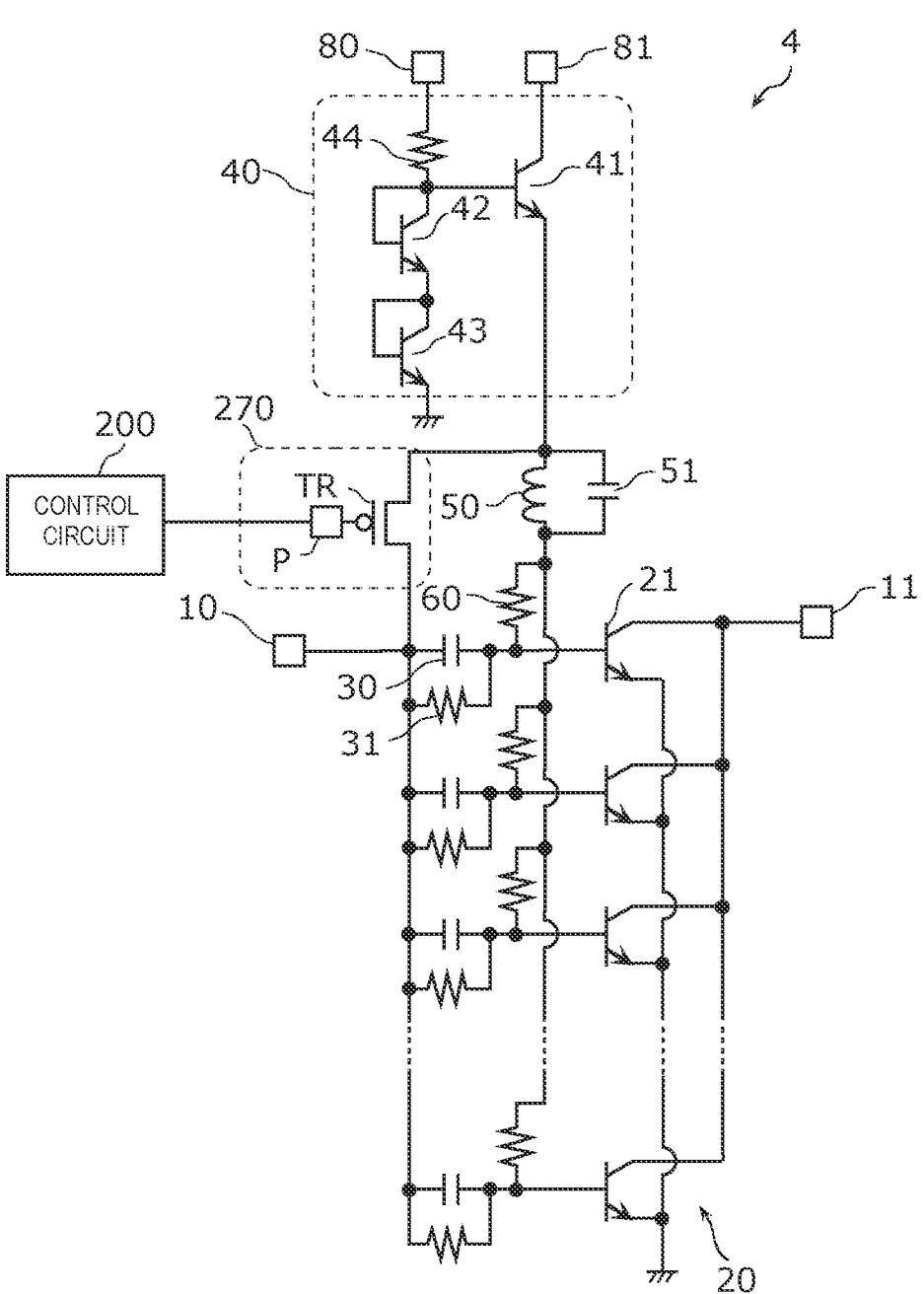
FIG. 11 is a circuit diagram of an amplifier unit according to a first modified example of the second embodiment.

A first modified example will first be discussed below with reference to FIG. 11. FIG. 11 is a circuit diagram of an amplifier unit 4 according to the present modified example.

As shown in FIG. 11, the amplifier unit 4 is different from the amplifier unit 3 in the connecting position of the variable resistor circuit 270. Additionally, as in the modified example of the first embodiment, a resistor 31 is connected in parallel with the DC-cut capacitor 30.

More specifically, in the amplifier unit 4, the variable resistor circuit 270 is connected to a path which links the input terminal 10 and the base of the amplifier transistor 21 with each other and is also connected to the terminal of the inductor 50 closer to the bias circuit 40. That is, in a manner similar to the variable resistor circuit 71 according to the modified example of the first embodiment, the variable resistor circuit 270 serves as a bypass path from the input terminal 10 to the emitter of the transistor 41 of the bias circuit 40. Part of a radio-frequency signal input into the input terminal 10 flows to the bias circuit 40 via the variable resistor circuit 270 and is coupled to the bias circuit 40. Hence, as in the second embodiment, it is possible to control the coupling amount between a radio-frequency signal and the bias circuit 40 by adjusting the resistance value of the variable resistor circuit 270.

In the amplifier unit 4 of the present modified example, too, as in the case of the ballast resistance of the first embodiment shown in FIG. 5B, when the resistance of the variable resistor circuit 270 is low, gain expansion is likely to occur, while, when the resistance of the variable resistor circuit 270 is high, gain compression is likely to occur.

Hence, as in the second embodiment, by changing the resistance value of the variable resistor circuit 270 in accordance with the magnitude of the current amplification factor β, gain expansion and gain compression can cancel each other out. This can reduce the distortion of the gain regardless of the magnitude of the current amplification factor β, as shown in FIG. 5C.

As the signal level of the output signal Vo1 input into the control terminal P is lower, the ON-resistance of the variable resistor circuit 270 becomes lower. For example, when the current amplification factor β is smaller than β0, the ON-resistance of the transistor TR becomes lower. The resistance value of the variable resistor circuit 270 thus becomes smaller. As a result, as in the first embodiment, gain compression (FIG. 5A) caused by a small current amplification factor β can be canceled out by gain expansion (FIG. 5B) resulting from the decreased resistance value of the variable resistor circuit 270.

As the signal level of the output signal Vo1 input into the control terminal P is higher, the ON-resistance of the transistor TR becomes higher. For example, when the current amplification factor β is larger than β0, the ON-resistance of the transistor TR becomes higher. The resistance value of the variable resistor circuit 270 thus becomes larger. As a result, as in the first embodiment, gain expansion (FIG. 5A) caused by a large current amplification factor β can be canceled out by gain compression (FIG. 5B) resulting from the increased resistance value of the variable resistor circuit 270.

2-5-2. Second Modified Example

Figure 12:
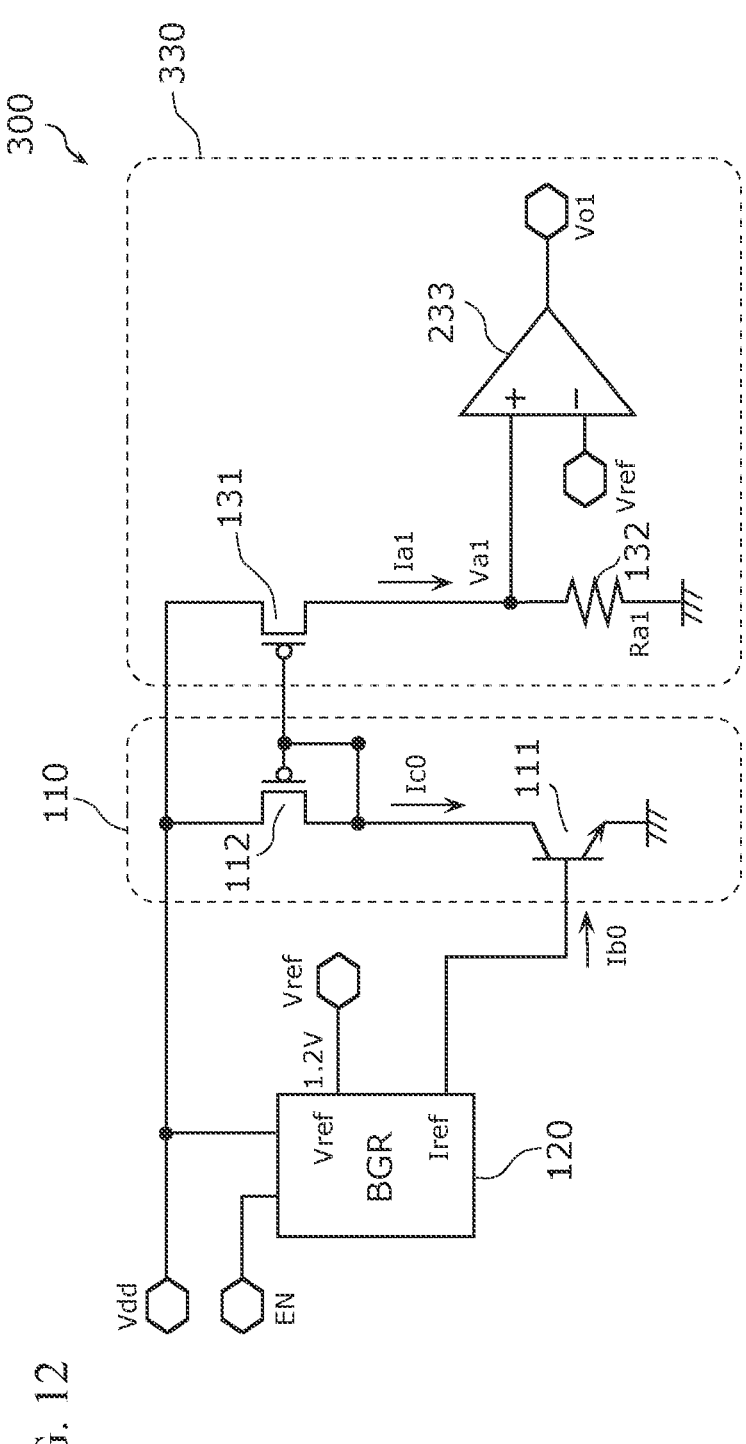
FIG. 12 is a circuit diagram of a control circuit of an amplifier unit according to a second modified example of the second embodiment.

A second modified example will now be discussed below with reference to FIG. 12. FIG. 12 is a circuit diagram of a control circuit 300 of an amplifier unit according to the present modified example.

As shown in FIG. 12, the control circuit 300 is different from the control circuit 200 of the second embodiment in that it includes a comparison circuit 330 instead of the comparison circuit 230. Additionally, the control circuit 300 does not include the timing circuit 150.

The comparison circuit 330 includes the transistor 131, the resistor 132, and the comparator 233. The comparison circuit 330 does not include the transmission gate 234 and the capacitor 235. That is, the configuration of the comparison circuit 330 is equivalent to that of the comparison circuit 230 of the second embodiment from which the transmission gate 234 and the capacitor 235 are removed. More specifically, the first input terminal of the comparator 233 is directly connected to a node between the transistor 131 and the resistor 132.

Figure 13:
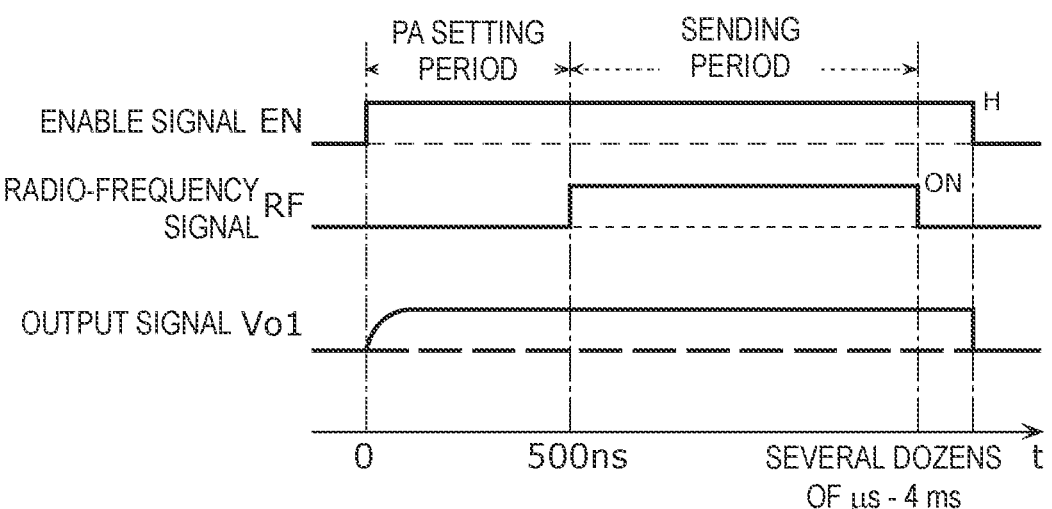
FIG. 13 is a time chart illustrating an operation of the amplifier unit according to the second modified example of the second embodiment.

FIG. 13 is a time chart illustrating the operation of the amplifier unit according to the present modified example. At the same time as the enable signal EN being made to have a high level, the voltage Va1 generated at the node between the transistor 131 and the resistor 132 is input into the first input terminal of the comparator 233. The output signal Vo1 output from the output terminal of the comparator 233 is varied in response to a change in the voltage Va1.

The comparison circuit 330 according to the present modified example does not include the transmission gate 234 and the capacitor 235. A measurement result of the current amplification factor β is thus reflected in the control operation for the variable resistor circuit 270 in real time. Even during the sending of a radio-frequency signal RF, for example, the resistance value of the variable resistor circuit 270 can be adjusted to a suitable value. Hence, a distortion compensation circuit can be speedily activated in response to a change in the temperature due to some reasons including self-heating, thereby suppressing the degradation of the linearity of the amplifier transistor 21.

(Others)

The amplifier units according to the present disclosure have been discussed above through illustration of the above-described embodiments and modified examples thereof. However, the disclosure is not restricted to the above-described embodiments.

In one example, the amplifier transistor 21, the replica transistor 111, or the transistor 41, 42, or 43 may be a bipolar transistor made of gallium arsenide (GaAs). The amplifier transistor 21 and the replica transistor 111 may be pnp-type bipolar transistors. In the case of a pnp-type bipolar transistor, the positions of the emitter and the collector in the above-described connection relationships are reversed.

In one example, the amplifier transistor 21, the replica transistor 111, or the transistor 41, 42, or 43 may be another type of transistor other than a bipolar transistor, for example, it may be a transconductance element. More specifically, the amplifier transistor 21, the replica transistor 111, or the transistor 41, 42, or 43 may be an FET, such as a MOSFET or a JFET. The gate, drain, and source of an FET correspond to the base, collector, and emitter, respectively.

In this case, the comparator uses transconductance of the replica transistor 111, which is a transconductance element, as the comparison target, instead of the current amplification factor of the replica transistor 111. The transconductance is an example of the amplification characteristic value of the amplifier transistor 21.

More specifically, the replica transistor 111 shown in FIG. 2, 8, or 12 is replaced by a transconductance element of the same type as the amplifier transistor 21. Specifically, the replica transistor 111 has a gate, a source, and a drain, as in the amplifier transistor 21. A gate voltage Vg0 for the replica transistor 111 is supplied from the reference voltage source 120. Then, the transconductance of the replica transistor 111 can be measured and be subjected to comparison.

In this manner, both of the amplifier transistor 21 and the replica transistor 111 may be transconductance elements. The measuring circuit 110 may measure the transconductance of the replica transistor 111.

This can compensate for variations in the transconductance caused by a temperature change and process variations.

The bias circuit 40 may include a source-follower circuit instead of an emitter-follower circuit. In this case, the inductor 50 is disposed between and in series with the source of the source-follower circuit and the control terminal of the amplifier transistor 21.

The transistors 112, 131, and 141 may be bipolar transistors.

As a result of setting different values for the resistance value Ra1 of the resistor 132 and the resistance value Ra2 of the resistor 142, the comparison circuits 130 and 140 can make a comparison by using different reference values. However, this is only an example. For instance, the resistance value Ra1 of the resistor 132 and the resistance value Ra2 of the resistor 142 may be equal to each other. In this case, the reference voltage Vref input into the second input terminal of the comparator 133 and that into the comparator 143 are made different from each other. For example, the reference voltage input into the comparator 143 may be made larger than that into the comparator 133. This can implement the configuration equivalent to the control circuit 100 according to the first embodiment.

In one example, the control circuit 100 may include three or more comparison circuits that make a comparison by using different reference values. In this case, the variable resistor circuit 70 or 71 may include three or more switches and three or more control terminals. Likewise, the control circuit 200 or 300 may include two or more comparison circuits that make a comparison by using different reference values.

Embodiments obtained by making various modifications to the above-described embodiments by those skilled in the art and embodiments achieved by combining elements and functions of the above-described embodiments without necessarily departing from the scope and spirit of the disclosure are also encompassed in the disclosure.

INDUSTRIAL APPLICABILITY

The present disclosure can be widely used in communication devices, such as cellular phones, as an amplifier circuit of a radio-frequency module disposed in a multiband-support front-end section.

REFERENCE SIGNS LIST

1, 2, 3, 4 amplifier unit
10 input terminal
11 output terminal
20 amplifier

21 amplifier transistor
30 DC-cut capacitor
31, 44, 132, 142 resistor
40 bias circuit
41, 42, 43, 112, 131, 141 transistor
50 inductor
51, 235 capacitor
60 ballast resistor
70, 71, 270 variable resistor circuit
80, 81 power supply terminal
100, 200, 300 control circuit
110 measuring circuit
111 replica transistor
120 reference voltage source
130, 140, 230, 330 comparison circuit
133, 143, 233 comparator
134, 144 D latch circuit
150 timing circuit
234 transmission gate
234a, 234b terminal
P, P1, P2 control terminal
R1, R2 resistor
SW1, SW2 switch
TR transistor

The invention claimed is:

1. An amplifier unit comprising:
an amplifier comprising an amplifier transistor, the amplifier transistor being configured to amplify an input radio-frequency signal;
a bias circuit connected to the amplifier;
an inductor connected between and in series with the amplifier and the bias circuit;
a variable resistor circuit connected in series with the inductor; and
a control circuit,
wherein the control circuit comprises:
a measuring circuit configured to measure an amplification characteristic value of the amplifier transistor, and
a comparison circuit configured to compare the amplification characteristic value measured by the measuring circuit with a reference value, and
wherein the control circuit is configured to control the variable resistor circuit based on a comparison result of the comparison circuit.

2. The amplifier unit according to claim 1, wherein the amplification characteristic value of the amplifier transistor is a current amplification factor or transconductance of a replica transistor, the replica transistor having a temperature change characteristic identical to a temperature change characteristic of the amplifier transistor.

3. The amplifier unit according to claim 2, wherein:
each of the amplifier transistor and the replica transistor is a bipolar transistor; and
the measuring circuit is configured to measure the current amplification factor of the replica transistor.

4. The amplifier unit according to claim 2, wherein:
each of the amplifier transistor and the replica transistor is a transconductance element; and
the measuring circuit is configured to measure the transconductance of the replica transistor.

5. The amplifier unit according to claim 2, wherein:
the measuring circuit comprises a first transistor connected to an output terminal of the replica transistor;
the comparison circuit comprises:
a comparator including a first input terminal, a second input terminal, and an output terminal, and a second transistor connected to the first input terminal of the comparator;

a reference voltage corresponding to the reference value is input into the second input terminal; and the first transistor and the second transistor form a current mirror circuit.

6. The amplifier unit according to claim 5, wherein the control circuit further comprises a reference voltage source connected to the second input terminal, the reference voltage source being configured to generate the reference voltage.

7. The amplifier unit according to claim 5, wherein the comparator is configured to output the comparison result from the output terminal of the comparator as a digital signal.

8. The amplifier unit according to claim 7, wherein:

the variable resistor circuit comprises:

a resistor, and a switch connected to the resistor; and the switch is configured to switch between an ON state and an OFF state based on the digital signal.

9. The amplifier unit according to claim 5, wherein the comparator is configured to output the comparison result from the output terminal of the comparator as an analog signal.

10. The amplifier unit according to claim 9, wherein the variable resistor circuit comprises a transistor, the transistor having a control terminal connected to the output terminal.

11. The amplifier unit according to claim 7, wherein the control circuit further comprises a retain circuit configured to retain a signal input into the first input terminal or a signal output from the output terminal.

12. The amplifier unit according to claim 11, wherein the retain circuit is a D latch circuit connected to the output terminal of the comparator.

13. The amplifier unit according to claim 11, wherein the retain circuit comprises:

a transmission gate that includes a first terminal and a second terminal, the second terminal being connected to the comparator, the transmission gate being configured to switch between an ON state and an OFF state between the first and second terminals, and a capacitor shunt-connected to the first terminal or the second terminal.

14. The amplifier unit according to claim 13, wherein:

the first terminal is connected to the second transistor;

the second terminal is connected to the first input terminal of the comparator; and the capacitor is connected to the second terminal.

15. The amplifier unit according to claim 11, wherein the retain circuit is configured to retain the signal input into the first input terminal or the signal output from the output terminal while the radio-frequency signal remains in the amplifier unit.

\* \* \* \* \*